United States Patent
Osawa et al.

(10) Patent No.: US 7,971,160 B2
(45) Date of Patent: Jun. 28, 2011

(54) CREATING METHOD OF PHOTOMASK PATTERN DATA, PHOTOMASK CREATED BY USING THE PHOTOMASK PATTERN DATA, AND MANUFACTURING METHOD OF SEMICONDUCTOR APPARATUS USING THE PHOTOMASK

(75) Inventors: Morimi Osawa, Kawasaki (JP); Takayoshi Minami, Kawasaki (JP); Satoru Asai, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 551 days.

(21) Appl. No.: 12/017,658

(22) Filed: Jan. 22, 2008

(65) Prior Publication Data

US 2008/0113280 A1    May 15, 2008

Related U.S. Application Data

(63) Continuation of application No. PCT/JP2005/013501, filed on Jul. 22, 2005.

(51) Int. Cl.
G06F 17/50    (2006.01)
G03C 5/00     (2006.01)
G03F 1/00     (2006.01)

(52) U.S. Cl. ............. 716/55; 716/54; 430/5; 430/322; 430/323; 430/324

(58) Field of Classification Search .............. 716/19, 716/21, 54, 55; 430/5, 322, 323, 324
See application file for complete search history.

(56) References Cited

U.S. PATENT DOCUMENTS

| | | | |
|---|---|---|---|
| 5,242,770 A * | 9/1993 | Chen et al. | 430/5 |
| 5,821,014 A | 10/1998 | Chen et al. | |
| 7,355,673 B2 | 4/2008 | Hsu et al. | |
| 2002/0157081 A1 * | 10/2002 | Shi et al. | 716/19 |
| 2002/0188925 A1 | 12/2002 | Higashi | |
| 2004/0166418 A1 | 8/2004 | Samuels | |

(Continued)

FOREIGN PATENT DOCUMENTS

CN    1577099 A    2/2005

(Continued)

OTHER PUBLICATIONS

International Search Report of PCT/JP2005/013501, date of mailing Oct. 25, 2005.

(Continued)

Primary Examiner — Thuan Do
Assistant Examiner — Magid Y Dimyan
(74) Attorney, Agent, or Firm — Westerman, Hattori, Daniels & Adrian, LLP

(57) ABSTRACT

A method for creating a pattern on a photomask includes steps of recognizing a space between main patterns by using pattern data which indicate the main patterns to be adjacently transferred onto a wafer, determining a 1st rule about arrangement of an assist pattern on the photomask, the assist pattern being adjacent to the main patterns and not being transferred onto the wafer, estimating a depth of focus in the presence of the assist pattern among the main patterns, determining a 2nd rule about arrangement of the assist pattern on the photomask to improve the depth of focus in the presence of the 1st assist pattern among the main patterns in a group having one or more number of appearance times of the space between main patterns, and correcting the assist pattern on the photomask using the assist pattern data on the basis of the 2nd rule.

15 Claims, 13 Drawing Sheets

U.S. PATENT DOCUMENTS

| | | |
|---|---|---|
| 2004/0172610 A1 | 9/2004 | Liebmann et al. |
| 2005/0028129 A1* | 2/2005 | Hsu et al. ............... 716/19 |
| 2005/0142454 A1 | 6/2005 | Fujimoto et al. |
| 2005/0153212 A1* | 7/2005 | Lavin et al. ............... 430/5 |
| 2005/0262467 A1* | 11/2005 | Croffie ............... 716/19 |
| 2006/0046160 A1* | 3/2006 | Wallace et al. ............... 430/5 |
| 2006/0240331 A1* | 10/2006 | O'Brien et al. ............... 430/5 |

FOREIGN PATENT DOCUMENTS

| | | |
|---|---|---|
| EP | 1500974 A2 | 1/2005 |
| JP | 2002311561 A | 10/2002 |
| JP | 2004266269 A | 9/2004 |
| JP | 2005-26701 A | 1/2005 |
| JP | 2005026701 A | 1/2005 |
| JP | 2005189683 A | 7/2005 |

OTHER PUBLICATIONS

Germany Office Action dated Jul. 1, 2010, issued in corresponding Germany Patent Application No. 112005003638.

Japanese Office Action dated Mar. 5, 2009, issued in corresponding Japanese Patent Application No. 2007-525488.

Chinese Office Action, issued Apr. 8, 2010 for corresponding Chinese Patent Application No. 2005-80051139.8.

* cited by examiner

CREATING METHOD OF PHOTOMASK PATTERN DATA, PHOTOMASK CREATED BY USING THE PHOTOMASK PATTERN DATA, AND MANUFACTURING METHOD OF SEMICONDUCTOR APPARATUS USING THE PHOTOMASK

BACKGROUND OF THE INVENTION

1. Field of the Invention

The present invention relates to a manufacturing method of a photomask that is preferable to the miniaturization of a pattern of a semiconductor apparatus and a manufacturing method of a semiconductor apparatus using the photomask. In particular, the present invention relates to a manufacturing method of a photomask that optimizes a sub resolution assist feature on a photomask so as to ensure the depth of focus for a formed image of a pattern for circuit formation of the photomask and a manufacturing method of a semiconductor apparatus using the photomask.

2. Description of the Related Art

In accordance with the miniaturization of the device size of a semiconductor apparatus, a resist pattern created by exposure from a photomask pattern is a pattern of approximately half of a wavelength of illumination light used for the exposure, i.e., a sub wavelength pattern in a photo-lithography step serving as one of manufacturing steps of the semiconductor apparatus. Then, in order to resolve the sub wavelength pattern, such a design is performed that an exposure device with high lens-performance having a high numerical aperture is used, a correcting pattern with respect to the optical proximity effect is added to the photomask pattern, and an off-axis illumination method serving as one of photomask illuminations is used.

Upon using the off-axis method to the photomask illumination method, an angle (identical to an angle of the 0-th-order diffraction light) of illumination light is set so that 0-th-order diffraction light and first-order diffraction light from a high-density portion of the photomask is incident on a lens. Then, with the off-axis method, the 0-th order diffraction light and the first-order diffraction light necessary for forming a pattern image can be incident even on a lens having a numerical aperture that is not greatly high.

Therefore, if the first-order diffraction light is greatly diffracted by the pattern portion with high density on the photomask, the resolution of the formed pattern image is improved, thereby obtaining a required depth of focus. Incidentally, with the necessary depth of focus, a pattern can be preferably formed even in consideration of the change in the best focusing position based on concaved and projected portions on the surface of a semiconductor apparatus or the focusing precision of the semiconductor apparatus.

A technology is proposed to ensure the necessary depth of focus even for a formed image from a coarse pattern portion by arranging a sub resolution assist feature with not-more-than the limit of resolution between mask patterns on a photomask.

With this technology, an exposure mask (photomask) comprises glass and a plurality of mask patterns containing chromium (Cr) coated to a glass surface. The mask pattern includes a main pattern subjected to deformation to offset the optical proximity effect due to light and etching based on a design pattern. Further, the mask pattern is arranged under a rule preset in accordance with the distance between the main patterns, and further includes an assist pattern for assisting the resolution of the main pattern, with a width of not-more-than the limit of resolution. Therefore, the existence of the assist pattern allows an optical image of the coarse main pattern to be close to an optical image of the main pattern with high density, thereby ensuring the depth of focus of the optical image of the coarse main pattern portion, approximate to that of the optical image of the main pattern with high density (e.g., Patent Document 1).

However, even in the case of creating the assist pattern under the preset rule, a high depth of focus cannot be obtained for all main patterns.

Patent Document 1: Japanese Unexamined Patent Application Publication No. 2001-100390

SUMMARY OF THE INVENTION

In order to solve the problem, according to this invention, there is provided a creating method of a photomask pattern data, comprising: a step of specifying that main patterns to be adjacently transferred onto a wafer are frequent with one positional relationship; and a step of creating pattern data of an assist pattern that is adjacent to the main patterns and is not transferred onto the wafer, wherein the pattern data of the assist pattern is created in accordance with the one positional relationship.

DESCRIPTION OF THE PREFERRED EMBODIMENTS

1. First Embodiment

A description will be given of a reticle manufacturing method according to the first embodiment with reference to FIGS. 1 to 8. Herein, a reticle according to the first embodiment is for forming a gate electrode pattern of an MOS transistor on a semiconductor apparatus. Further, the reticle is one type of photomasks, and has a formed pattern generally having a metallic thin-film, e.g., chromium (Cr) thin film on silicon glass. Furthermore, the reticle is used for transferring a reticle pattern onto a resist coated onto the semiconductor apparatus in a lithography step, serving as one of manufacturing steps of the semiconductor apparatus. In addition, the transferred resist pattern is used as a mask for etching a material on the semiconductor apparatus. As a consequence, a circuit pattern of the semiconductor apparatus is formed.

Figure 1:
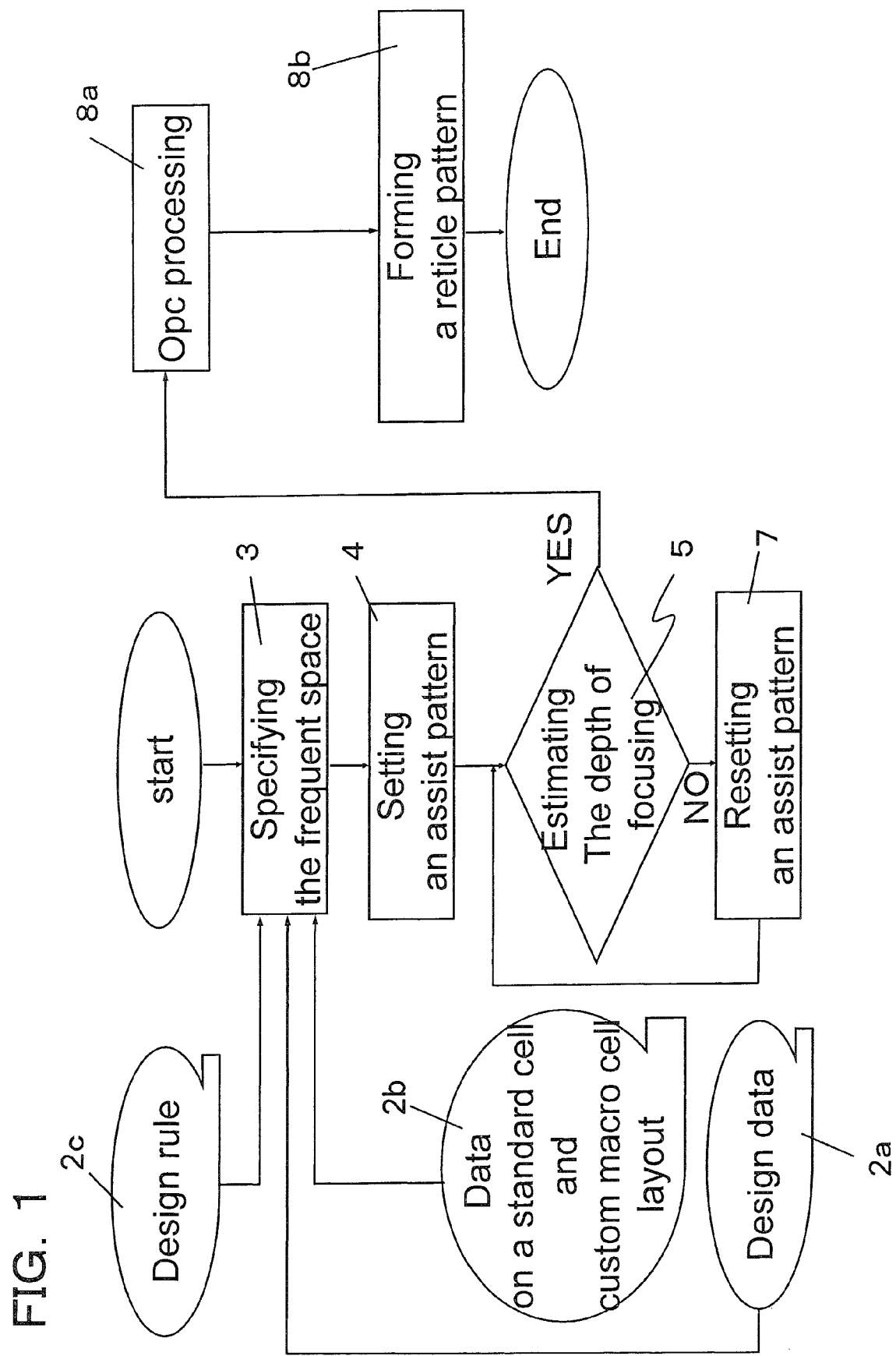
FIG. 1 is a flowchart showing steps of a reticle manufacturing method according to the first embodiment.

FIG. 1 is a flowchart showing steps of a reticle manufacturing method according to the first embodiment. Referring to FIG. 1, reference numeral 2a denotes design data, reference numeral 2b denotes data on a standard cell and custom macro cell layout of a semiconductor apparatus, reference numeral 2c denotes a design rule, reference numeral 3 denotes a step of "specifying the frequent space", reference numeral 4 denotes a step of "setting an assist pattern", reference numeral 5 denotes a step of "estimating the depth of focus", reference numeral 7 denotes a step of "resetting an assist pattern", reference numeral 8a denotes a step of "OPC (optical Proximity correction) processing", and reference numeral 8b denotes a step of "forming a reticle pattern".

Herein, the design data 2a is data indicating a circuit pattern of the semiconductor apparatus, or data indicating a main pattern extracted from the data indicating the circuit pattern. The main pattern is a pattern created by a one-time photolithography step among the circuit patterns of the semiconductor apparatus. Further, the assist pattern is a pattern that assists that the main pattern is transferred onto a resist of the semiconductor apparatus, and is called a sub resolution assist feature (SRAF) that is not transferred to the resist because it is not resolved. Furthermore, the main pattern is subjected to OPC processing in consideration of the assist pattern, which will be described later, together with the main pattern, and the main pattern and assist pattern become a metallic thin-film pattern on the reticle.

In addition, the data 2b on the standard cell and custom macro cell layout on the semiconductor apparatus is layout data with a physical shape, forming a basic logical circuit.

The design rule 2c is a rule for forming the circuit pattern of the semiconductor apparatus by a lithography technology without fail, e.g., a rule for prescribing the minimum space between gate patterns of the MOS transistor, the minimum line width of the gate pattern, and the minimum space between the gate pattern and a contact window.

The step 3 of specifying the frequent space is a step of specifying the frequent space by using the design rule 2c and the data 2b on the standard cell and custom macro cell layout on the semiconductor apparatus, from among the spaces between the main patterns included in the design data 2a. The step 4 of setting the assist pattern is a step of setting the assist pattern and creating assist pattern data under a predetermined rule with respect to the assist pattern.

The step 5 of estimating the depth of focus is a step of estimating the depth of focus of the image formed onto the resist of the main pattern with the assist pattern set in the step 4 of setting the assist pattern and the step 6 of resetting the assist pattern.

The step 7 of resetting the assist pattern is a step of changing the rule for setting the assist pattern when the depth of focus for the formed image of the main pattern with the frequent space is not enough, resetting the assist pattern so as to improve the density of the assist pattern sandwiched between the main patterns with the frequent space, and creating the assist pattern data after the resetting.

The step 8a of the OPC processing is a step of creating mask pattern data indicating a pattern obtained by performing the OPC processing of the main pattern using data indicating the main pattern and data indicating the assist pattern. Herein, the OPC processing is for deforming in advance the pattern used for the transfer so as to correct the deformation of the transfer pattern due to the advantage of the optical proximity exposure.

The step 8b of forming the reticle pattern is a step of forming a metallic thin-film pattern of the reticle by the steps on the basis of the mask pattern data.

Hereinbelow, the steps will be described in details with reference to FIGS. 2, 3, 4, 5, 7, 8a, and 8b.

Figure 2:
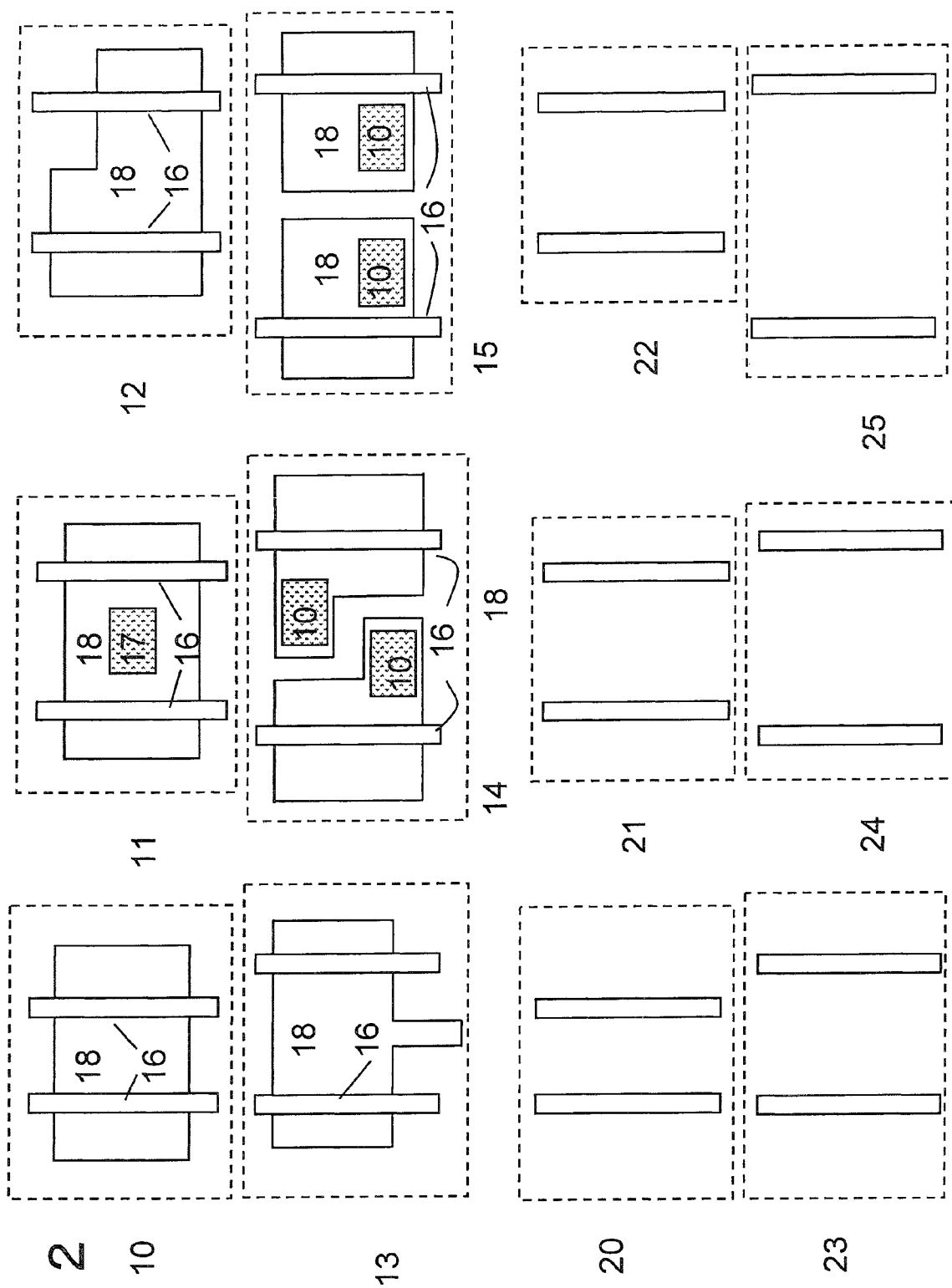
FIG. 2 is a diagram for illustrating contents of design data.

FIG. 2 is a diagram for illustrating contents of the design data. Herein, the design data and the main pattern are same as the design data and the main pattern described above with reference to FIG. 1.

Referring to FIG. 2, reference numerals 10, 11, 12, 13, 14, and 15 denote planar patterns of two MOS transistors that are adjacently arranged, reference numeral 16 denotes a gate electrode pattern, reference numeral 17 denotes a contact window pattern, reference numeral 18 denote a field pattern for determining the transistor, and reference numerals 20, 21, 22, 23, 24, and 25 denote gate electrode patterns.

Herein, the planar patterns 10, 11, 12, 13, 14, and 15 of the MOS transistor are formed by using the minimum space and the minimum line width permitted under the design rule so as to reduce the size of the circuit pattern of the semiconductor apparatus, in particular, the size of the pattern of the MOS transistor.

The planar pattern 10 of the MOS transistor comprises: the rectangular field pattern 18; and the two gate electrode patterns 16 that cross the field pattern 18 and are adjacent to each other in parallel therewith at the minimum space.

The planar pattern 11 of the MOS transistor comprises: the rectangular field pattern 18; the contact window pattern 17; and the two gate electrode patterns 16 that cross the field pattern 18 and sandwich the contact window pattern 17 adjacently to the contact window pattern 17 at the minimum space.

The planar pattern 12 of the MOS transistor comprises: the field pattern 18 that forms one field region by making two rectangles with different heights adjacent to each other; and the gate electrode pattern 16 that cross a rectangular region every rectangular region.

The planar pattern 13 of the MOS transistor comprises: the field pattern 18 having a rectangle and a projected portion from the rectangle; and the two gate electrode patterns 16 that sandwich the projected portion and are adjacent to the projected portion at the minimum space.

The planar pattern 14 of the MOS transistor comprises: the combination of two field patterns 18 having a rectangle and a rectangular projected portion in association with the rectangle; the two contact window patterns 17 that are arranged to the rectangular projected portions; and the two gate electrode patterns 16 that cross the field pattern 18 every field pattern 18.

The planar pattern 15 of the MOS transistor comprises: the two field patterns 18 that are rectangular and are adjacent to each other; the two contact window patterns 17 arranged every field pattern 18; and the two gate electrode patterns 16 that cross the field pattern 18 every field pattern 18.

The gate electrode patterns 20, 21, 22, 23, 24, and 25 are obtained by extracting the gate electrode patterns 16 of the planar patterns 10, 11, 12, 13, 14, and 15 of the MOS transistor.

Further, the circuit pattern of the semiconductor apparatus includes, e.g., the planar patterns 10, 11, 12, 13, 14, and 15 of the MOS transistor, and further includes a wiring pattern for connecting circuit elements. Furthermore, the main pattern comprises only a pattern used in one-time photo-lithography step, like the gate electrode patterns 20, 21, 22, 23, 24, and 25, when the reticle is used in the gate electrode forming step.

Then, the design data is data indicating the main pattern, e.g., coordinate data indicating the gate electrode patterns 20, 21, 22, 23, 24, and 25, or data indicating the circuit pattern of the semiconductor apparatus, e.g., coordinate data indicating the planar patterns 10, 11, 12, 13, 14, and 15 of the MOS transistor and the wiring pattern for connecting the circuit elements.

Figure 3:
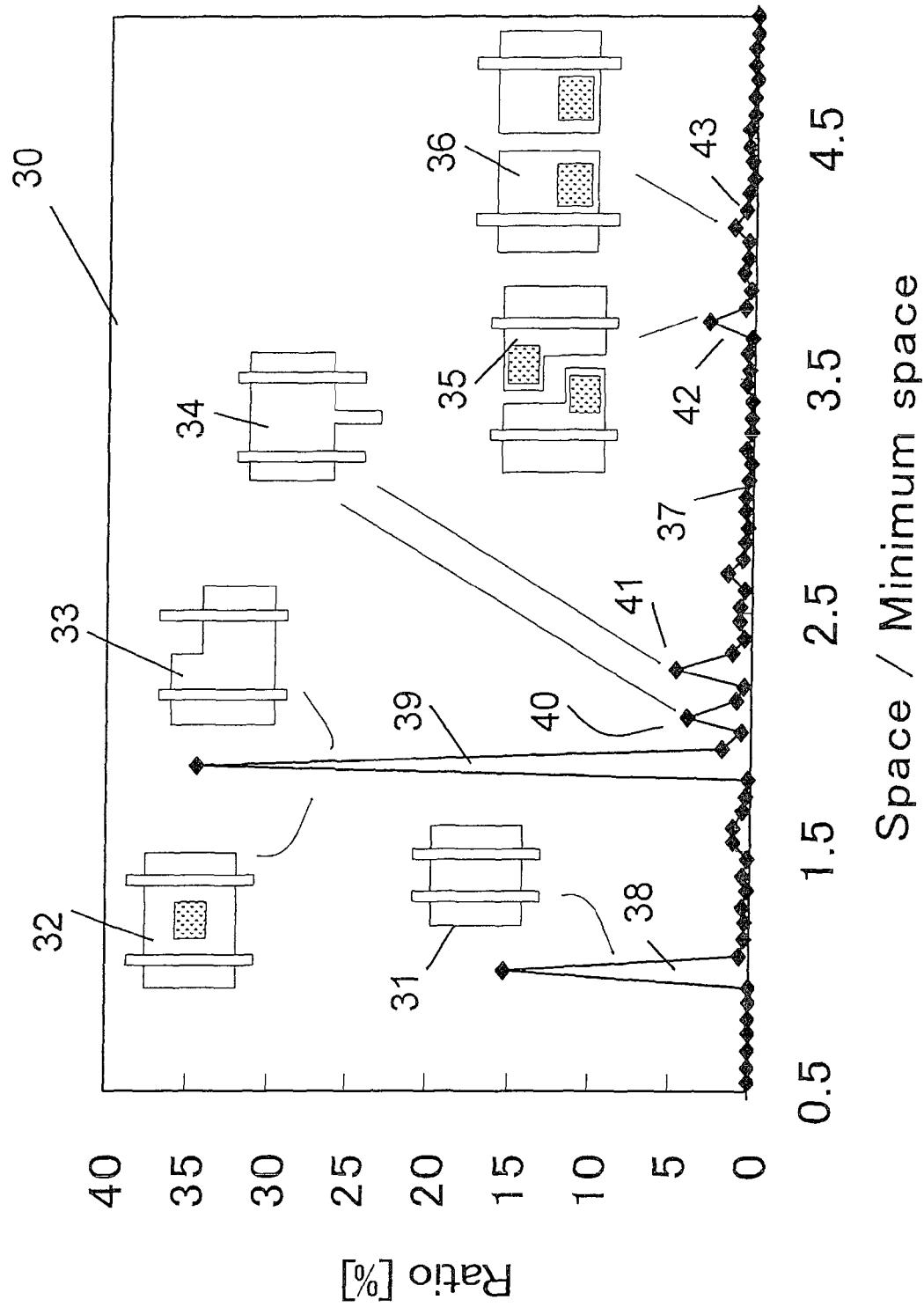
FIG. 3 is a diagram for illustrating a step 3 of specifying a frequent space.

FIG. 3 is a diagram for illustrating showing the step 3 of specifying the frequent space. Referring back to FIG. 1, in the step 3 of specifying the frequent space, "one or more frequent spaces are specified from among the spaces between the main patterns" by "classifying the space between the main patterns with the data indicating the main pattern and integrating the number of appearance times of the space", by "classifying the space between the main patterns with the data 2b on the standard cell and custom macro cell layout and estimating the number of appearance times of the space", or by "estimating from the design rule 2c". Herein, the frequent space indicates a frequent space from among the spaces between the main patterns based on the circuit pattern of the semiconductor apparatus.

Incidentally, the step 3 of specifying the frequent space is performed by using the design data 2a (the data indicating the main pattern), the data 2b on the standard cell and custom macro cell layout, and the design rule 2c in the flowchart shown in FIG. 1. Since the design data 2a (the data indicating the main pattern), the data 2b on the standard cell and custom macro cell layout, and the design rule 2c have been already created at the time for the step 1 of starting the reticle manufacture, the step 3 of specifying the frequent space can be executed in advance.

Referring to FIG. 3, reference numeral 30 denotes a graph, reference numerals 31, 32, 33, 34, 35, and 36 denote the planar patterns of the MOS transistor, reference numeral 37 denotes a broken line having black rhombic shapes and s line for connecting the black rhombic shapes, and reference numerals 38, 39, 40, 41, 42, and 43 denote peak portions of the broken lines.

The graph 30 is obtained by plotting the number of appearance times at the space between the main patterns of the reticle for forming the gate electrode pattern. Herein, the ordinate denotes, by using the percentage, a ratio of the number of appearance times to the total number of appearance times at the space. Further, the abscissa denotes a ratio of the space to the minimum space. Furthermore, the broken line 37 denotes a ratio of the number of appearance times every space, having the peak portion 38 indicating 15% at 1 as the ratio of the minimum space to the space, the peak portion 39 indicating 34% at 1.8 as the ratio thereof, the peak portion 40 indicating approximately 3% at 2.1 as the ratio thereof, the peak portion 41 indicating approximately 4% at 2.3 as the ratio thereof, the peak portion 42 indicating approximately 2.5% at 3.8 as the ratio thereof, and the peak portion 43 indicating approximately 1% at 4.1 as the ratio thereof. Further, the peak portion 38 appears corresponding to the pattern 31 (similar to the pattern 10 of the MOS transistor shown in FIG. 2) of the MOS transistor. The peak portion 39 appears corresponding to the patterns 32 and 33 (similar to the patterns 11 and 12 of the MOS transistor shown in FIG. 2) of the MOS transistor. The peak portions 40 and 41 appear corresponding to the pattern 34 (similar to the pattern 13 of the MOS transistor shown in FIG. 2) of the MOS transistor. The peak portion 42 appears corresponding to the pattern 35 (similar to the pattern 14 of the MOS transistor shown in FIG. 2) of the MOS transistor. The peak portion 43 appears corresponding to the pattern 36 (similar to the pattern 15 of the MOS transistor shown in FIG. 2) of the MOS transistor. Incidentally, the peak portions 38, 39, 40, 41, 42, and 43, i.e., the frequent spaces of the gate electrode pattern correspond to the patterns of the MOS transistor. Therefore, different spaces obviously become the frequent spaces if the design rule 2c shown in FIG. 2 changes, as mentioned above.

Further, the step 3 of specifying the frequent space is performed, the graph 30 shows the result obtained by "integrating the number of appearance times of the space between the main patterns with the data indicating the main pattern" or by "estimating the number of appearance times of the space between the main patterns with the data 2b on the standard cell and custom macro cell layout".

Herein, a description will be given of the reticle having the gate electrode pattern as the main pattern, particularly, the case in which "the space between the main patterns is classified with the data indicating the main pattern and the number of appearance times of the space is integrated" according to the first embodiment.

First, the space between the gate electrode patterns and the width thereof are recognized from the coordinate data of the gate electrode pattern, included in the data indicating the main pattern. Subsequently, the space between the gate electrode patterns is classified. The number of appearance times of the classified space of the gate electrode pattern is integrated.

Incidentally, the above operation can be also performed together with operation, i.e., DRC (design rule check) for checking to see if the circuit pattern satisfies the design rule upon creating the circuit pattern of the semiconductor apparatus. Because the DRC includes the recognition and the classification of the space between the gate electrode patterns.

Further, with respect to the reticle having the gate electrode pattern as the main pattern, a description will be given of the case in which "the space between the main patterns is classified and the number of appearance times of the space is estimated with the data 2b on the standard cell and custom macro cell layout" according to the first embodiment.

First, the data 2b on the standard cell and custom macro cell layout of the semiconductor apparatus is created in advance. Then, the space between the gate electrode patterns existing in the cell layout is recognized and classified in advance.

Then, the number of using times of the data 2b on the standard cell and custom macro cell layout used for the semiconductor apparatus as a target is counted.

By multiplying the number of using times of the cell layout to the space between the gate electrode patterns classified in advance, the number of appearance times of the space between the gate electrode patterns is calculated. Incidentally, if there is the same space between the gate electrode patterns in different types of the cell layout, obviously, the sum of the number of appearance times of the spaces between the gate electrode patterns is calculated.

As a consequence, a part or all of a large number of appearance times of the space between the gate electrode patterns is specified as the frequent space.

Subsequently, when "specifying one or more frequent spaces from among the spaces between the main patterns" by "estimation from the design rule 2c", the space between the gate electrode patterns is specified as the frequent space from the patterns 31, 32, 33, 34, 35, and 36 of the MOS transistor. Because, the planar patterns 31, 32, 33, 34, 35, and 36 of the MOS transistor are planar patterns created by using the minimum space and the minimum line width permitted under the design rule so as to reduce the size of the patterns of the MOS transistor. Therefore, since the minimization in chip size of the semiconductor apparatus is aimed, the planar patterns 31, 32, 33, 34, 35, and 36 of the MOS transistor can be used as much as possible.

Incidentally, the step of specifying the frequent space is specified based on the information as mentioned above and the information may be combined by weighting the information.

Figure 4:
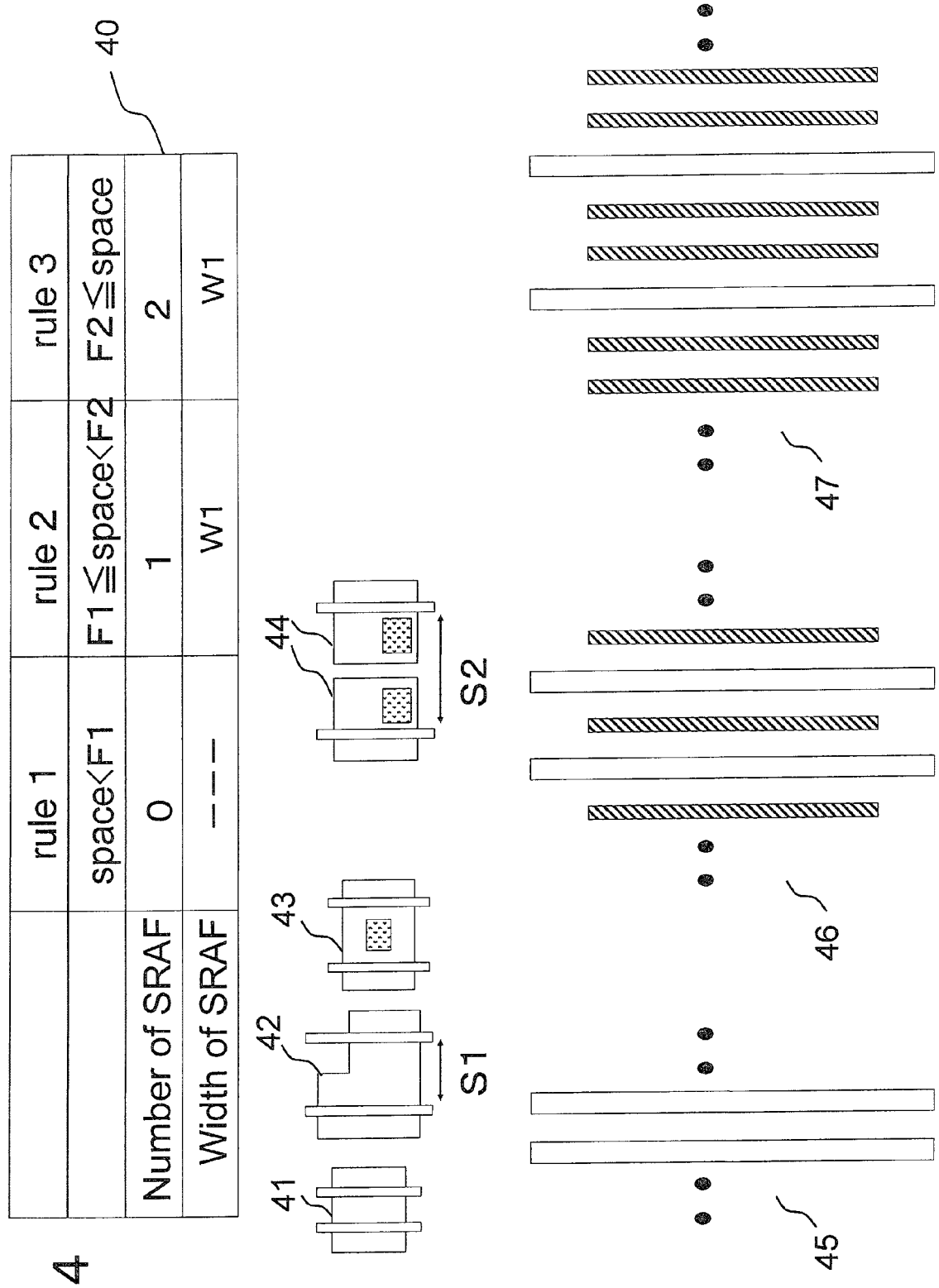
FIG. 4 is a diagram for illustrating a step of setting an assist pattern.

FIG. 4 is a diagram for illustrating the step of setting the assist pattern. Herein, the assist pattern is included in the reticle. The assist pattern has the shape of the resolution limit or less, is arranged between the main patterns so as to ensure the depth of focus for the formed image of the main pattern, and is called a sub resolution assist feature (SRAF). Further, in the step of setting the assist pattern, the assist pattern is set between the main patterns on the basis of a predetermined rule, and assist pattern data is created. Incidentally, in the step of setting the assist pattern, with a virtual calculator, the data indicating the assist pattern, i.e., the assist pattern data is created for the data indicating the main pattern.

Referring to FIG. 4, reference numeral 40 denotes a rule table for arranging the assist pattern, reference numerals 41, 42, and 43 denote pattern examples of the MOS transistor under a first rule, reference numeral 44 denotes an pattern example of the MOS transistor under a second rule, reference numeral 45 denotes an arrangement example of the main pattern and the assist pattern under the first rule, reference numeral 46 denotes an arrangement example of the main pattern and the assist pattern under the second rule, and reference numeral 47 denotes an arrangement example of the main pattern and the assist pattern under the third rule.

Incidentally, the pattern examples 41, 42, 43, and 44 of the MOS transistor are the same as the patterns 10, 12, 11, and 15 of the MOS transistor shown in FIG. 2. However, since the design rules are different, the pattern examples 41, 42, 43, and 44 of the MOS transistor have the space between the gate electrode patterns, different from the pattern examples of the MOS transistor shown in FIG. 2. Incidentally, the space between the gate electrode patterns of the pattern example 41 of the MOS transistor is minimum in FIG. 4. The space between the gate electrode patterns of the pattern example 42 of the MOS transistor is S1. The space between the gate electrode patterns of the pattern example 44 of the MOS transistor is S2. The space between the gate electrode patterns of the pattern example 43 of the MOS transistor is between S1 and S2.

The rule table 40 denotes a predetermined rule upon arranging the assist pattern. The first rule indicates that, when the space between the main patterns is F1 or less, the number of the assist patterns to be arranged is 0. The second rule indicates that, when the space between the main patterns is between F1 and F2, the width of the assist pattern arranged between the main patterns is W1 and the number of the assist patterns to be arranged is 1. The third rule indicates that, when the space between the main patterns is F2 or more, the width of the assist pattern arranged between the main patterns is W1 and the number of the assist patterns to be arranged is 2. Incidentally, F1 indicates the smallest space at which one assist pattern can be arranged between the main patterns in consideration of the best width of the assist pattern for ensuring the depth of focus and the minimum space between the assist pattern and the main pattern. Further, F2 indicates the smallest space at which two assist patterns can be arranged between the main patterns in the similar consideration. Therefore, values of F1 and F2 obviously depend on a wavelength of illumination light, an exposure method, and an exposure condition. Incidentally, the illumination light is, e.g., ArF (argon fluoride) excimer laser and has a wavelength of 193 nm.

The arrangement example 45 of the main pattern and the assist pattern under the first rule indicates that the assist pattern is not arranged between the main patterns shown by an outline pattern. The arrangement example 46 for of the main pattern and the assist pattern under the second rule indicates that one assist pattern is arranged between the main patterns shown by an outline pattern. The arrangement example 47 of the main pattern and the assist pattern under the third rule indicates that two assist patterns are arranged between the main patterns shown by an outline pattern.

Then, the step of setting the assist pattern is performed in the reticle manufacturing for creating the gate electrode pattern as the main pattern as follows.

First, it is determined that which rule in the rule tables for arranging the assist pattern is used by the space between the gate electrode patterns due to pattern examples 41, 42, 43, and 44 of the MOS transistor. Subsequently, the assist pattern is arranged under the determined rule. That is, the first rule is applied to the pattern examples 41, 42, and 43 of the MOS transistor and the arrangement example 45 between the main pattern and the assist pattern is therefore used. Further, the second rule is applied to the pattern example 44 of the MOS transistor and the arrangement example 46 of the main pattern and the assist pattern is therefore used.

Incidentally, the assist pattern is arranged by creating the assist pattern data for the data indicating the main pattern.

Figure 5:
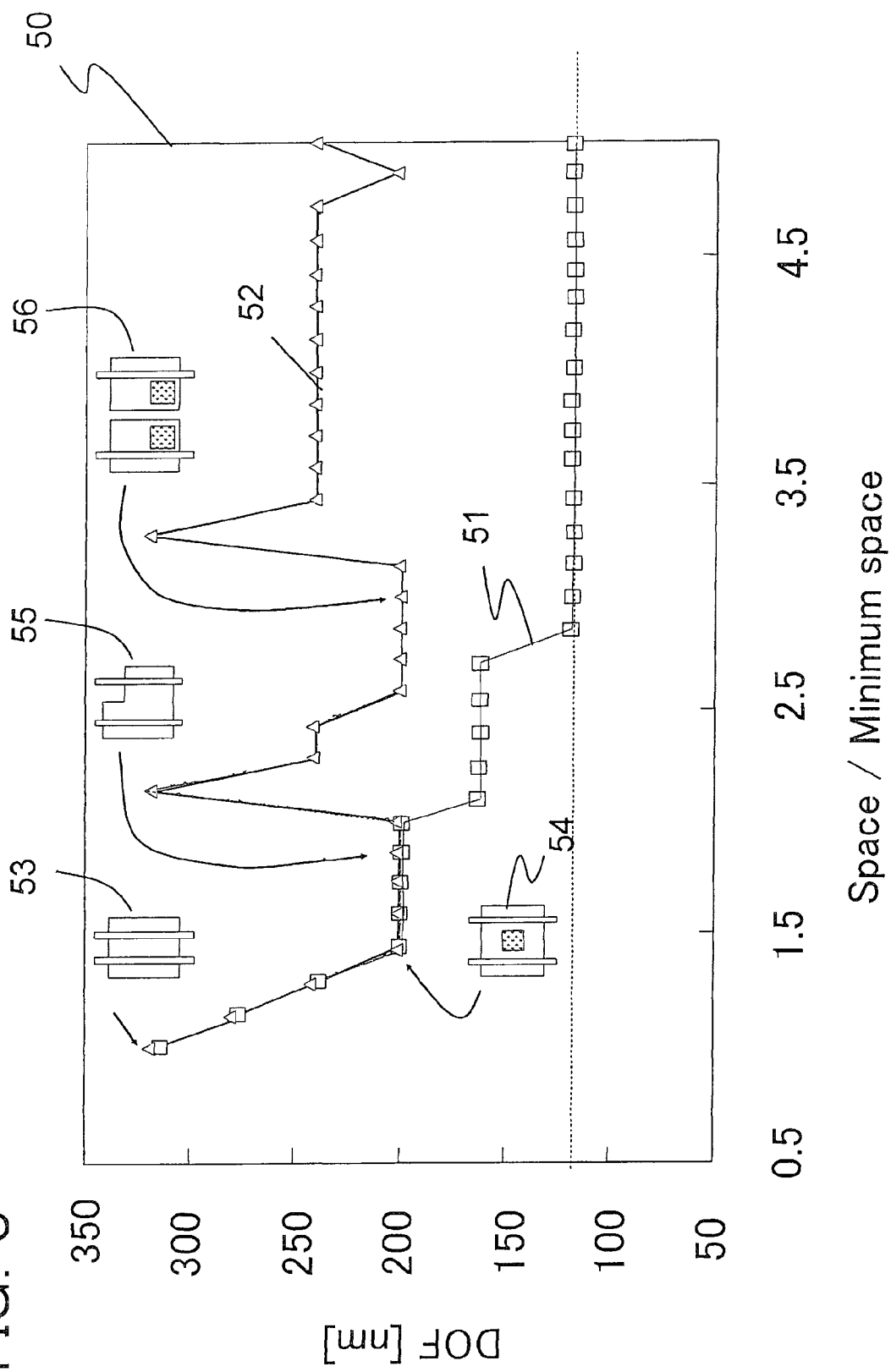
FIG. 5 is a diagram for illustrating a "step of estimating the depth of focus".

FIG. 5 is a diagram for illustrating "the step of estimating the depth of focus". Referring to FIG. 5, reference numeral 50 denotes a graph, reference numeral 51 denotes white squares and a broken line for connecting the white squares, reference numeral 52 denotes white triangles and a broke line for connecting the white triangles, and reference numerals 53, 54, 55, and 56 denote pattern examples of the MOS transistor.

The pattern examples 53, 54, 55, and 56 of the MOS transistor are similar to the pattern examples 41, 42, 43, and 44 of the MOS transistor.

The graph 50 is obtained by plotting the depth of focus to the space between the main patterns of the reticle for creating the gate electrode pattern. Herein, the ordinate denotes the depth of focus (expressed as DOF (depth of focus) in the graph) within a range from 50 nm to 350 nm. Further, the abscissa denotes a ratio of the space between the main patterns to the minimum space within a range of 0.5 to 5.0. The broken line 51 denotes the depth of focus for the space between the main patterns, when the assist pattern is not arranged. Specifically, the broken line 51 denotes the DOF of approximately 320 nm at the space of a ratio of 1 (corresponding to the minimum space), DOF of approximately 200 nm at the space of a ratio of 1.5 (corresponding to the space between the gate electrode patterns of the pattern example 54 of the MOS transistor), DOF of approximately 200 nm at the space of a ratio of approximately 2.0 (corresponding to the space between the gate electrode patterns of the pattern example 55 of the MOS transistor), DOF of 160 nm at the space of a ratio of approximately 2.5, DOF of 120 nm at the space of a ratio of approximately 3.0 (corresponding to the pattern example 56 of the MOS transistor), and DOF of 120 nm at the space of a ratio of 4.5, respectively. That is, if the space between the main patterns is wider, the DOF drops to be gradually close to 120 nm.

When the assist pattern is arranged under the predetermined rule shown in FIG. 4, the broken line 52 shows the depth of focus for the space between the main patterns. Specifically, the broken line 52 shows the DOF of approximately 310 nm at the space of a ratio of 1 (corresponding to the minimum space), DOF of approximately 200 nm at the space of a ratio of 1.5 (corresponding to the space between the gate electrode patterns of the pattern example 54 of the MOS transistor), DOF of approximately 200 nm at the space of a ratio of approximately 2.0 (corresponding to the space between the gate electrode patterns of the pattern example 55 of the MOS transistor), DOF of approximately 310 nm at the space of a ratio of 2.1, DOF of approximately 230 nm at the space of a ratio of 2.5, DOF of approximately 200 nm at the space of a ratio of 3.0 (corresponding to the pattern example 56 of the MOS transistor), DOF of 310 nm at the space of a ratio of 3.3, and DOF of approximately 230 nm at the space of a ratio of 4.5, respectively.

That is, the assist pattern is arranged between the main patterns. Then, when the density of the patterns comprising the assist pattern and the main pattern is substantially identical to that in the case of arranging the main patterns at a ratio of 1, the formed image of the patterns comprising the assist pattern and the main pattern shows substantially the identical DOF. Herein, the obtained density of the pattern is substantially identical because the assist pattern is arranged on the basis of the rule shown in the table 40 in FIG. 4. Therefore, referring to FIG. 5, the space F1 in the table 40 shown in FIG. 4 has a ratio of 2.1. Further, the space F2 in the table 40 shown in FIG. 4 has a ratio of 3.3.

Then, in "the step of estimating the depth of focus", a calculator is used with simulation software. In other words, optical simulation obtains the depth of focus (DOF). Further, obviously, the depth of focus can experimentally form and obtain a desired pattern with the changed space between the main patterns and the changed layout of the assist pattern.

In the example of the reticle manufacturing step for forming the gate electrode shown in FIG. 5, first, as shown by the broken line 52 in the graph 50, an estimation result of the depth of focus is obtained for the space between the gate electrode patterns having the ratio. Subsequently, as shown in FIG. 3, it is determined whether or not the formed image of the gate electrode pattern has the necessary depth of focus for the frequent space between the gate electrode patterns due to the pattern examples 53, 54, 55, and 56 of the MOS transistor having a large number of appearance times. If the necessary depth of focus is ensured, the current arrangement of the assist pattern is used and the processing advances to a step of forming the assist pattern data. On the other hand, if the necessary depth of focus is not ensured, the processing advances to a step of rearranging the assist pattern. For example, as shown in FIG. 5, the depths of focus (DOFs) for the formed images of the pattern examples 54, 55, and 56 of the MOS transistor are approximately 200 nm and it is determined that the DOF is not sufficient.

Figure 6:
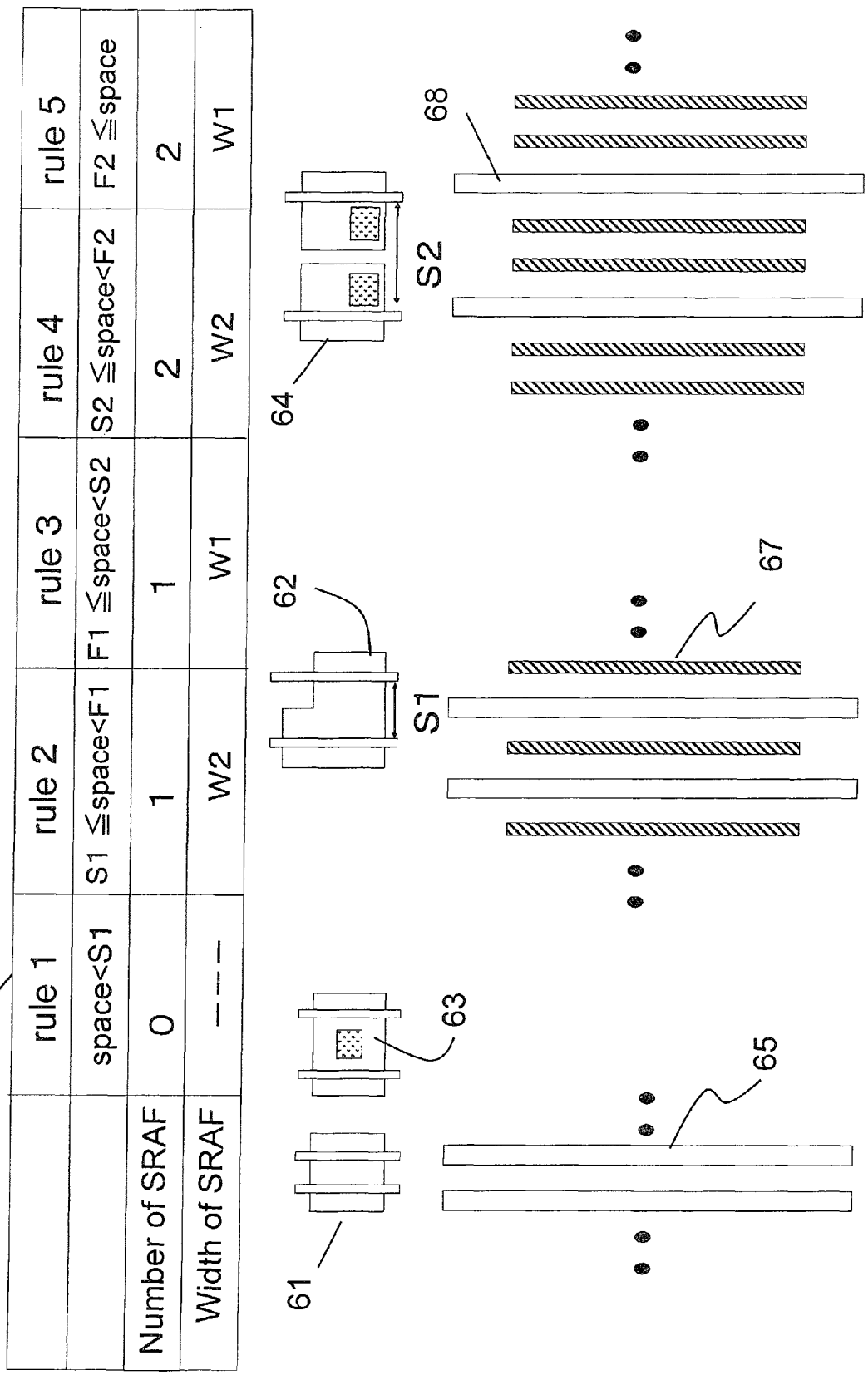
FIG. 6 is a diagram for illustrating a step of resetting the assist pattern.

FIG. 6 is a diagram for illustrating a step of resetting the assist pattern. Herein, the definition of the assist pattern is similar to the definition of the assist pattern shown in FIG. 4. Further, in the step of resetting the assist pattern, the assist pattern is set and the assist pattern data is created so that a part or all of the depth of focus for the main patterns have a necessary value or more, i.e., the density of the assist patterns arranged between the main patterns having the frequent space is improved. For example, a density improvement rule that is determined to improve the density of the assist patterns in accordance with the frequent space between the main patterns can be reset, and the assist pattern generated in advance can be replaced with the assist pattern re-generated on the basis of the density improvement rule. Alternatively, only the assist pattern between the main patterns having the frequent space may be replaced with the assist pattern with the improved density.

Referring to FIG. 6, reference numeral 60 denotes a table indicating an arrangement rule for improving the density of the assist pattern, reference numeral 61 denotes a pattern example of the MOS transistor having the minimum space between the gate electrodes, reference numeral 62 denotes a pattern example of the MOS transistor having the space between the gate electrodes that is S1, reference numeral 63 denotes a pattern example of the MOS transistor having the space between the gate electrodes that is not less than F1 and less than S2, reference numeral 64 denotes a pattern example of the MOS transistor having the space between the gate electrodes that is S2, reference numeral 65 denotes an arrangement example of the main pattern and the assist pattern when the space between the gate electrodes is less than S1, reference numeral 67 denotes an arrangement example of the main pattern and the assist pattern when the space between the gate electrodes is not less than S1 and less than S2, and reference numeral 68 denotes an arrangement example of the main pattern and the assist pattern having the space between the gate electrodes that is not less than S2. Incidentally, the pattern examples 61, 62, 63, and 64 of the MOS transistor are similar to the patterns 10, 12, 11, and 15 of the MOS transistor shown in FIG. 2. Therefore, in order to reduce the size of the circuit pattern of the semiconductor apparatus, in particular, reduce the size of the pattern of the MOS transistor, the patterns are obviously planar patterns formed by using the minimum space and the minimum line width that are permitted under the design rule.

A description will be given of the arrangement rule table 60 for improving the density of the assist pattern. If the space between the main patterns is less than S1, the first rule shows that the number of the assist patterns to be arranged is 0. If the space between the main patterns is not less than S1 and less than F1, the second rule shows that the width of the assist pattern arranged between the main patterns is W2 and the number of the assist patterns to be arranged is 1. If the space between the main patterns is not less than F1 and less than S2, the third rule shows that the width of the assist pattern arranged between the main patterns is W1 and the number of the assist patterns to be arranged is 1. If the space between the main patterns is not less than S2 and less than F2, the fourth rule shows that the width of the assist pattern arranged between the main patterns is W2 and the number of the assist patterns to be arranged is 2. If the space between the main patterns is not less than F2, the fifth rule shows that the width of the assist pattern arranged between the main patterns is W1 and the number of the assist patterns to be arranged is 2. Incidentally, F1 and F2 have the same values as those shown in FIG. 4. Further, S1 denotes the space between the gate electrodes due to the pattern example 62 of the MOS transistor, and S2 denotes the space between the gate electrodes due to the pattern example 64 of the MOS transistor. Herein, W2 has a value with W1 based on a relation of W2<W1<2×W2. That is, W2 is smaller than W1. However, if increasing the number of the assist patterns, the total width (2×W2) of the assist pattern is larger than W1. Further, W2 in the second rule and the fourth rule may be continuously changed in accordance with the space and, alternatively, W2 in the second rule and the fourth rule may not be the same value.

The arrangement patterns 45, 46, and 47 for arranging the assist pattern between the main patterns shown in FIG. 4 have the same arrangement patterns as the arrangement example 65 of the main pattern and the assist pattern when the space between the gate electrodes is less than S1, the arrangement example 67 of the main pattern and the assist pattern when the space between the gate electrodes is not less than S1 and less than S2, and the arrangement example 68 of the main pattern and the assist pattern when the space between the gate electrodes is not less than S2.

In the above cases, only the assist pattern between the main patterns having the frequent space is replaced with the assist pattern having the improved density.

Then, in the reticle manufacturing of forming the gate electrode pattern as the main pattern, the step of resetting the assist pattern is performed as follows.

First, the space between the gate electrode patterns due to the pattern example 62 of the MOS transistor is S1. Further, the space between the gate electrode patterns due to the pattern example 64 of the MOS transistor is S2. Because a large number of the main patterns comprise those patterns as important and coarse mask patterns. Therefore, if the necessary depth of focus is obtained for those patterns, the gate electrode patterns of the MOS transistor are uniform. As a result, advantageously, characteristics of the MOS transistor can be equalized. Incidentally, the necessary depth of focus enables preferable pattern formation even in consideration of the change in best focusing position based on caved and projected portions on the surface of the semiconductor apparatus or the precision of the focal point of the apparatus.

Next, the assist pattern is reset under the arrangement rule table 60 for improving the density of the assist pattern.

In the above description, the width of the assist pattern is W2 and the number of the assist patterns is increased, thereby improving the density of the assist pattern between the main patterns. Obviously, the width of the assist pattern can be increased. The width of the assist pattern and the number of assist patterns to be arranged can be optimize for the space shown by S1 or S2.

Further, under the arrangement rule table 60 for improving the density of the assist pattern, the case in which the width of the assist pattern is W2 and the case in which it is W1 are set. However, if the width of the assist pattern is W2 for all the spaces between the main patterns, the depth of focus at the frequent space has the same value. In this case, at a region having one assist pattern separately having a space of S1<space<F1 and a space of F1<space<S2, the separated spaces can be combined to a space of S1<space<S2. Similarly, even at a region having two assist patterns, the spaces can be combined to a space of S2<space.

Incidentally, the assist pattern is arranged by creating the assist pattern data for the data indicating the main pattern.

Figure 7:
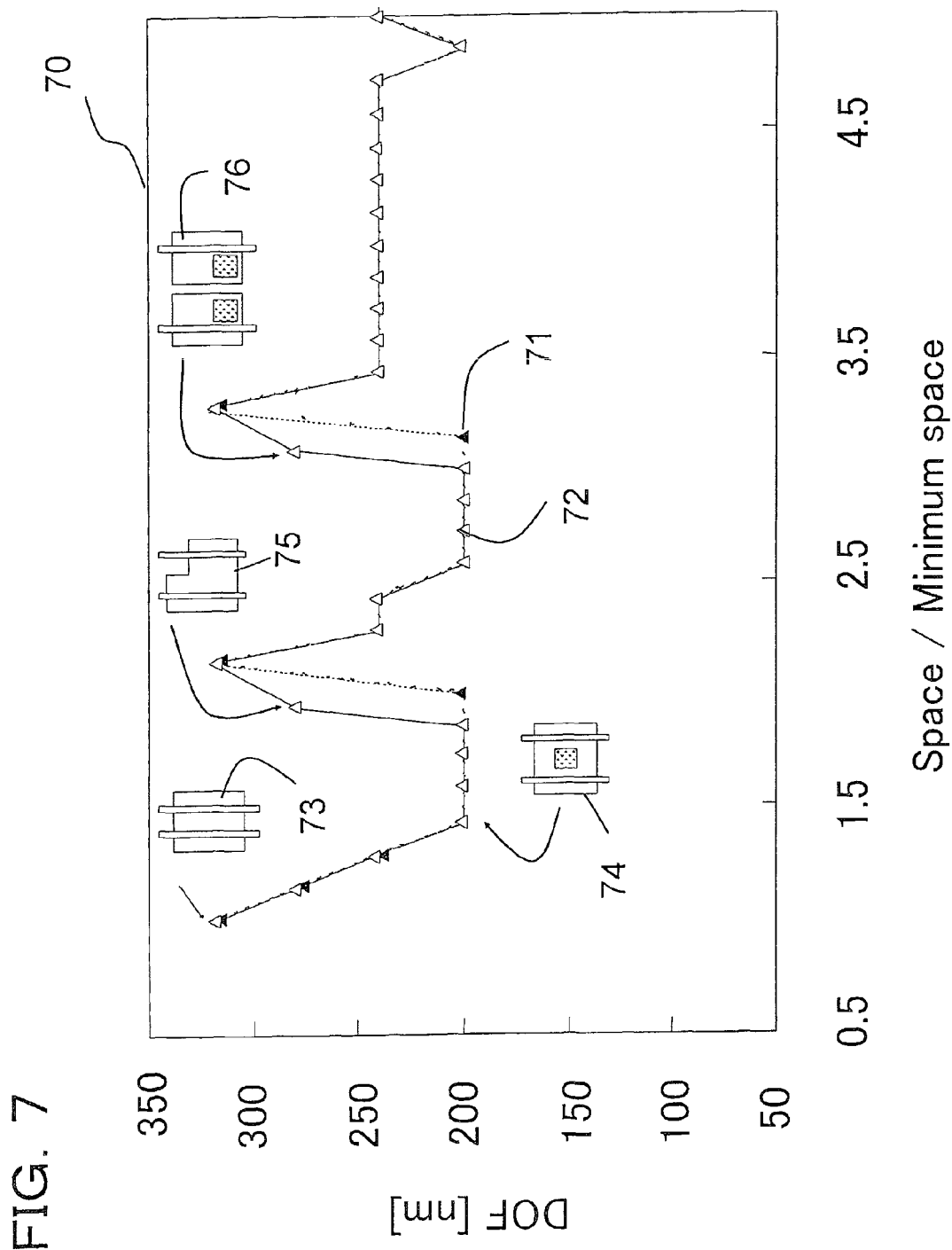
FIG. 7 is a diagram showing advantages due to rearrangement of the assist pattern shown in FIG. 6.

FIG. 7 is a diagram showing the advantages due to the re-arrangement of the assist pattern shown in FIG. 6. Referring to FIG. 7, reference numeral 70 denotes a graph, reference numeral 71 denotes black squares and a broken line for connecting the black squares, reference numeral 72 denotes white triangles and a broken line for connecting the white triangles, and reference numerals 73, 74, 75, and 76 denote pattern examples of the MOS transistor.

The pattern examples 73, 74, 75, and 76 of the MOS transistor are identical to the pattern examples 41, 42, 43, and 44 of the MOS transistor.

The graph 70 is obtained by plotting the depth of focus for the space between the main patterns of the reticle for forming the gate electrode pattern. Herein, the ordinate denotes the depth of focus (expressed as DOF (depth of focus) in the graph) within a range from 50 nm to 350 nm. Further, the abscissa denotes a ratio of the space between the main patterns to the minimum space, within a range from 0.5 to 5.0 with the minimum space having the ratio of "1". Further, the broken line 71 is similar to the broken line 52 in the graph 50 shown in FIG. 5.

The broken line 72 denotes the depth of focus for the space between the main patterns in the arrangement situation of the assist pattern shown in FIG. 6. Specifically, the broken line 72 denotes the DOF of approximately 320 nm at the space of a ratio of 1 (corresponding to the minimum space), DOF of approximately 200 nm at the space of a ratio of 1.5 (corresponding to the space between the gate electrode patterns of the pattern example 74 of the MOS transistor), DOF of approximately 280 nm at the space of a ratio of approximately 2.0 (corresponding to the space between the gate electrode patterns of the pattern example 75 of the MOS transistor), DOF of approximately 320 nm at the space of a ratio of approximately 2.1, DOF of approximately 200 nm at the space of a ratio of 2.5, DOF of approximately 280 nm at the space of a ratio of 3.0 (corresponding to the pattern example 76 of the MOS transistor), DOF of approximately 320 nm at the space of a ratio of 3.3, and DOF of approximately 240 nm at the space of a ratio of 4.5, respectively.

That is, in the arrangement situation of the assist pattern shown in FIG. 6, at the space of the ratio of approximately 2.0 and the space of the ratio of 3.0, serving as the frequent space, the necessary depth of focus (DOF) can be changed.

Incidentally, mainly, the assist pattern is caused on the basis of the frequency pattern according to the first embodiment of the present invention. Further, if there is room in the calculator resource, the occurrence of the assist pattern for a pattern approximate to the frequency one can also be reset.

Figure 8:
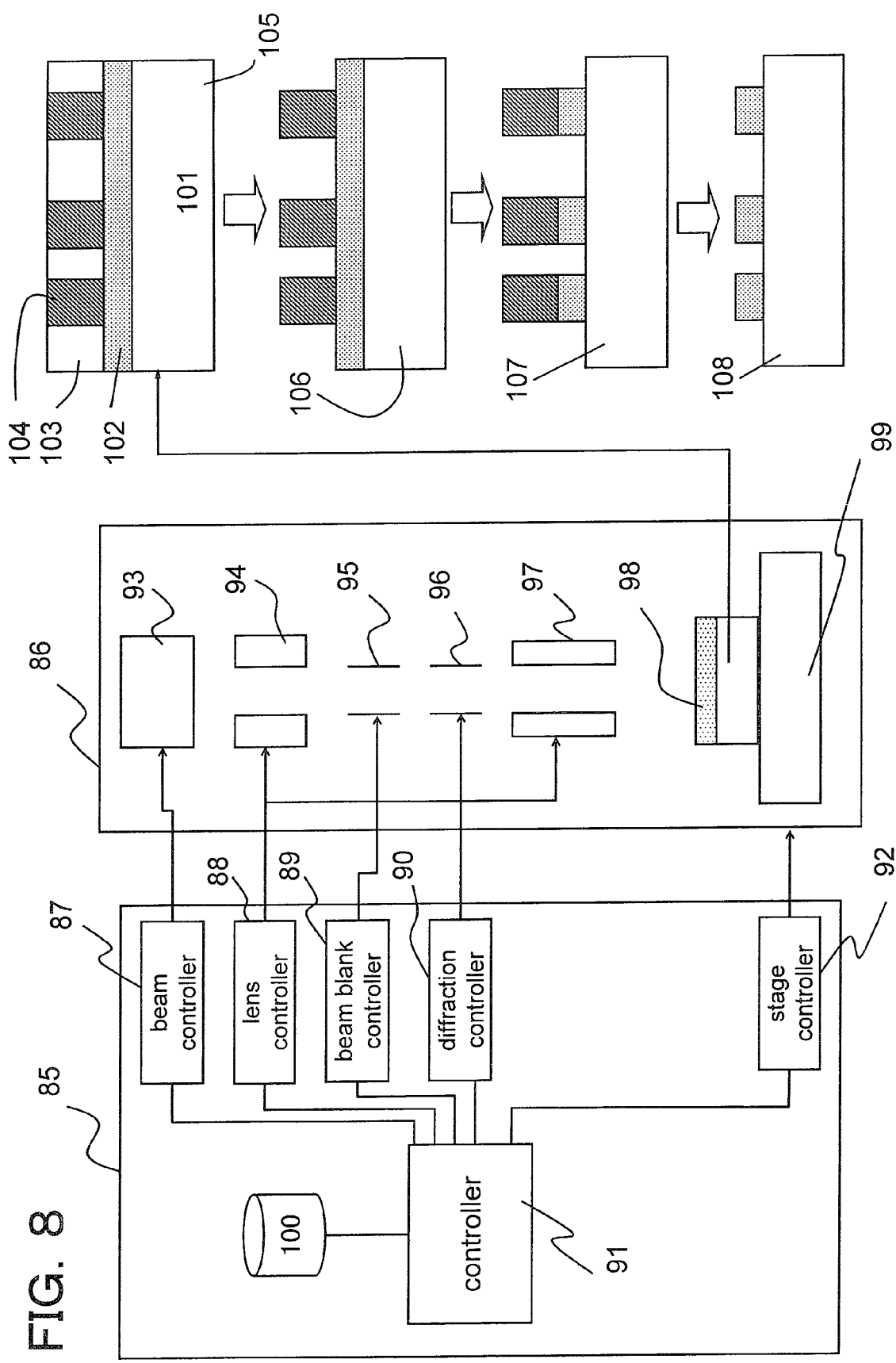
FIG. 8 is a diagram for illustrating a figure drawing device used for a step of forming a reticle pattern shown in FIG. 1 and a reticle forming step performed with design data and assist pattern data.

FIG. 8 is a diagram for illustrating a figure drawing device used for the reticle pattern forming step shown in FIG. 1 and a reticle pattern forming step by using the design data and the assist pattern data. Herein, in the reticle pattern forming step, the reticle pattern is formed by using the design data shown in FIG. 1 and the assist pattern data reset in FIG. 6.

Referring to FIG. 8, reference numeral 85 denotes a control unit of the figure drawing device, reference numeral 86 denotes a beam emission unit of the figure drawing device, reference numeral 87 denotes a beam controller, reference numeral 88 denotes a lens controller, reference numeral 89 denotes a beam blank controller, reference numeral 90 denotes a diffraction controller, reference numeral 91 denotes a controller, reference numeral 92 denotes a stage controller, reference numeral 93 denotes a beam emission unit, reference numeral 94 denotes an electrical-field lens, reference numeral 95 denotes beam blank, reference numeral 96 denotes diffraction, reference numeral 97 denotes an electrical-field lens, reference numeral 98 denotes a reticle, reference numeral 99 denotes a stage, reference numeral 100 denotes design data and assist pattern data, reference numeral 101 denotes a quartz substrate of a photomask, reference numeral 102 denotes a metallic thin-film on the quartz substrate of the reticle, reference numeral 103 denotes resist, reference numeral 104 denotes a resist portion subjected to beam emission, reference numeral 105 denotes a cross-sectional view after ending the beam emission, reference numeral 106 denotes a cross-sectional view after removing the resist 103, reference numeral 107 denotes a cross-sectional view after etching the metallic thin-film 102, and reference numeral 108 denotes a cross-sectional view after removing the resist pattern.

Further, the beam emission unit 96 of the figure drawing device comprises: the beam emission unit 93; the electrical-field lens 94 that stops down the beams; the beam blank 95 having a function for shutting-down the beams; the diffraction 96 that controls the direction of the beams; the electrical-field lens 97 that stops down the beams at the beam emission target; and the stage 99 on which the reticle 98 is mounted. Furthermore, the controller portion of the figure drawing device has a function for controlling the beam emission unit of the figure drawing device, and also has a function for controlling the beam emission on the basis of the design data and assist pattern data 100. In addition, the controller 91 of the figure drawing device comprises: the beam controller 87 that controls the beam emission unit 93; the lens controller 88 that controls the electrical-field lenses 94 and 97; the beam controller 89 that controls the beam blank 95; the diffraction controller 90 that controls the diffraction 96; the stage controller 92 that controls the stage 99; the controller 91; and the design data and assist pattern data 100. The controller 91 controls the beam controller 87, the lens controller 88, the beam blank controller 89, the diffraction controller 90, and the stage controller 92 on the basis of the design data and assist pattern data 100.

Then, the step of forming the reticle pattern shown in FIG. 1 is performed by the following sequence. First, the metallic thin-film 102 is deposited on the quartz substrate 101, and the resist 103 is coated on the film. Subsequently, the beam emission unit 86 of the figure drawing device emits beams to the resist 103 to match a resist pattern to be formed by using the design data and assist pattern data 100. Then, a state is shown in the cross-sectional view 105 after ending the beam emission. Subsequently, the resist portion 104 hardened by the beam emission remains and the resist 103 is removed, thereby forming the resist pattern. Then, a state is shown in the cross-sectional view 106 after removing the resist 103.

Subsequently, the resist pattern is subjected to anisotropic etching onto the mask, thereby forming the reticle pattern comprising the metallic thin-film 102. Then, a state is shown in the cross-sectional view 107 after etching the metallic thin-film 102. Subsequently, after removing the resist pattern, a state is shown in the cross-sectional view 108 after removing the resist pattern. Therefore, the reticle pattern comprising the metallic thin-film 102 remains on the quartz substrate 101, and the reticle pattern comprising the metallic thin-film 102 on the reticle is formed.

Then, the pattern of the metallic thin-film 102 of the reticle shown in FIG. 8 is formed, thereby ending all the reticle manufacturing steps.

As mentioned above, the reticle manufacturing method according to the first embodiment includes the steps shown in the flowchart in FIG. 1. Then, with the reticle manufacturing method according to the first embodiment, by performing the steps, the assist pattern shown in FIG. 6 is arranged between the main patterns having the frequent space. Therefore, with the reticle manufacturing method according to the first embodiment, the reticle can be manufactured to ensure the necessary depth of focus for the formed image of the main pattern having the frequent space on the reticle, as shown in FIG. 7.

Herein, at the space between the main patterns extracted from the circuit pattern, a frequent space to which a large number of the main patterns belong appears. Because, in the design of the circuit pattern of the semiconductor apparatus, if designing the circuit pattern of the semiconductor apparatus so as to minimize the chip size of the semiconductor apparatus and to be permitted under the design rule, the minimum space and width of the circuit pattern permitted under the design rule are frequently used with the arrangement of the circuit pattern having a predetermined relationship, if there is a degree of freedom of arrangement under the design rule.

If ensuring the necessary depth of focus for the main pattern having the frequent space, a large number of patterns transferred onto the semiconductor apparatus are uniform. As a consequence, advantageously, the circuit on the semiconductor apparatus concerned with the transfer pattern has uniform characteristics.

2. Second Embodiment

A description will be given of a reticle manufacturing method according to the second embodiment with reference to FIG. 9. Herein, a reticle according to the second embodiment is for forming a contact pattern of the semiconductor apparatus. Further, similarly to the manufacturing method of the photomask according to the first embodiment, the method for manufacturing the reticle for forming the contact pattern according to the second embodiment includes the steps shown in the flowchart in FIG. 1.

However, unlike the first embodiment, the main pattern of the reticle manufactured in the flowchart shown in FIG. 1 is based on the contact pattern of the semiconductor apparatus. Therefore, the frequent space is different among the spaces between the main patterns. Further, the assist pattern is arranged to ensure the necessary depth of focus for the formed image of the main pattern having the frequent space following the different rules.

Incidentally, the contact pattern according to the second embodiment is a contact pattern for connecting the wiring to a field pattern.

Figure 9:
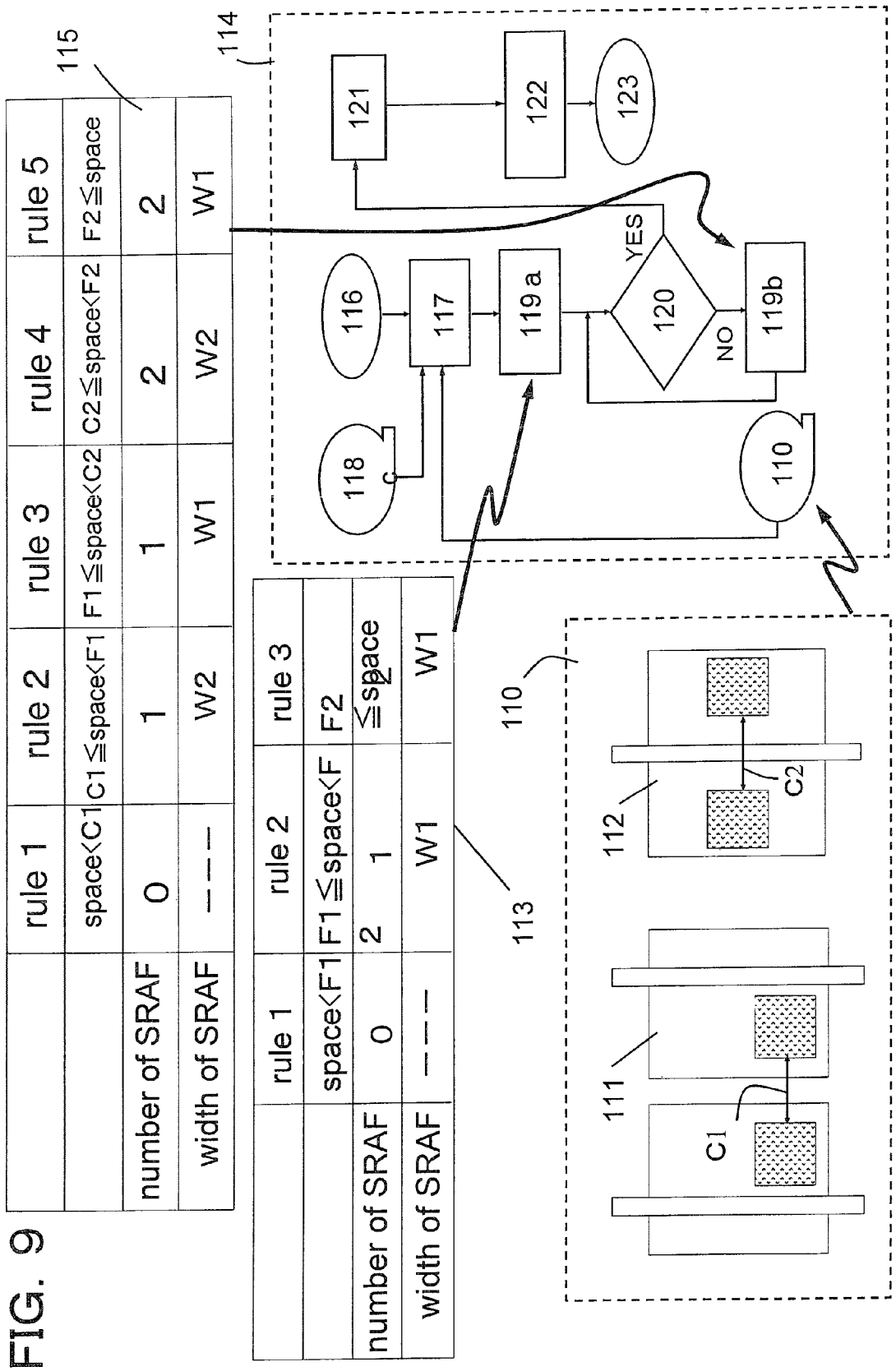
FIG. 9 is a diagram for illustrating a reticle manufacturing method according to the second embodiment for the purpose of describing the above-mentioned different points.

FIG. 9 is a diagram for illustrating the reticle manufacturing method according to the second embodiment for the purpose of describing the above different points.

Referring to FIG. 9, reference numeral 110 denotes design data, reference numerals 111 and 112 denote pattern examples of the MOS transistor, including the contact pattern of the semiconductor apparatus, reference numeral 113 denotes a setting rule table of a predetermined assist pattern, reference numeral 114 denotes a flowchart of the reticle manufacturing method according to the second embodiment, reference numeral 115 denotes an arrangement rule table for improving the density, reference numeral 116 denotes start of reticle manufacturing, reference numeral 117 denotes specifying of the frequent space, reference numeral 118c denotes a design rule, reference numeral 119a denotes setting of the assist pattern, reference numeral 119b denotes resetting of the assist pattern, reference numeral 120 denotes estimation of the depth of focus, reference numeral 121 denotes OPC processing, reference numeral 122 denotes formation of the reticle pattern, and reference numeral 123 denotes end of the reticle manufacturing.

The pattern example 111 of the MOS transistor comprises two MOS transistors adjacently arranged. The MOS transistors comprise a rectangular field pattern, a gate electrode pattern crossing the field pattern, and one contact pattern arranged to one side of the gate electrode. Further, two MOS transistors are arranged to be symmetric to each other in the double-truck state, and the contact patterns thereof face each other, sandwiching the symmetric axis. Herein, a space between the contact patterns is C1.

The pattern example 112 of the MOS transistor comprises an MOS transistor comprising a rectangular field pattern, a gate electrode pattern, and two contact patterns. The contact patterns are arranged to the left and right, sandwiching the gate electrode. Herein, a space between the contact patterns is C2. Incidentally, the contacts connect a field region of the semiconductor apparatus to a wiring, and exist at the position where the field region is overlapped to the wiring. Further, the contact patterns form the contacts.

The design data 110 is expressed by the contact pattern of the semiconductor apparatus as the coordinate data, or is expressed by the circuit pattern (e.g., the pattern examples 111 and 112 of the MOS transistor and a wiring pattern for connecting the circuit elements) of the semiconductor as coordinate data.

The setting rule table 113 of a predetermined assist pattern is the same as the rule table shown in FIG. 4. Further, the arrangement rule table 115 for improving the density is the same as the arrangement rule table for improving the density shown in FIG. 6. However, S1 and S2 in the table, indicating the arrangement situations of the assist pattern shown in FIG. 6, are replaced with C1 and C2 indicating the space between the contact patterns. The design rule 118c is the same as the design rule described above with reference to FIG. 1.

The flowchart 114 of the reticle manufacturing method according to the second embodiment includes: the start 116 of the reticle manufacturing; the specifying 117 of the frequent space; the setting 119a of the assist pattern; the resetting 119b of the assist pattern; the estimation 120 of the depth of focus; the OPC processing 121; the formation 122 of the reticle pattern; and the end 123 of the reticle manufacturing. Further, the steps are the same as those included in the flowchart shown in FIG. 1.

However, differently, in the step 117 of specifying the frequent space, "one or more frequent spaces are specified from among the spaces between the main patterns by estimation from the design rule", thereby specifying the space C1 between the contact patterns of the pattern example 111 of the MOS transistor and the space C2 between the contact patterns of the pattern example 112 of the MOS transistor. It is possible to specify the space C1 between the contact patterns and the space C2 between the contact patterns by the following reasons. First, in order to minimize the semiconductor apparatus, in the formation of all the pattern examples 111 and 112 of the MOS transistor, the estimation is possible by using the minimum space and the minimum line width under the design rule. Like the pattern example 111 of the MOS transistor, it is possible to estimate the appearance of an example of the MOS transistors adjacently arranged upon arranging the MOS transistors by sandwiching a signal line or a power line and frequently appearing the space. Further, like the pattern example 112 of the MOS transistor, the example of arranging the contact patterns by sandwiching the gate electrode of the MOS transistor is necessary to structure the MOS transistor, this is estimated to be frequency.

Therefore, with the reticle manufacturing method according to the second embodiment, in the setting 119a of the assist pattern, the assist pattern is created under the rule table 113. Thereafter, in step 120 of estimating the depth of focus, it is determined whether or not the formed image of the contact pattern having the spaces C1 and C2 has the depth of focus on the semiconductor apparatus.

Consequently, when it is determined that the formed image of the contact pattern having the spaces C1 and C2 does not have the necessary depth of focus on the semiconductor apparatus, the step 119b of resetting the assist pattern is performed. Further, like arrangement rule table 115 for improving the density, the assist pattern between the main patterns based on the contact pattern on the semiconductor apparatus is arranged.

Incidentally, the step 119a of setting the assist pattern and the step 119b of resetting the assist pattern are performed by generating the data indicating the assist pattern for the data indicating the main pattern on the calculator.

As a consequence, with the reticle manufacturing method according to the second embodiment, it is possible to manufacture the reticle of the contact pattern on the semiconductor apparatus, on which the necessary depth of focus is ensured for the formed image of the main pattern having the frequent space on the reticle. Then, the characteristics of a large number of contacts are equalized. Advantageously, the circuit on the semiconductor apparatus, concerned with the contact pattern, has uniform characteristics.

3. Third Embodiment

A description will be given of a reticle manufacturing method according to the third embodiment with reference to FIG. 10. Herein, a reticle according to the third embodiment is for forming a wiring pattern of the semiconductor apparatus. Further, the method for the reticle to form the wiring pattern according to the third embodiment includes the steps shown in the flowchart in FIG. 1, similarly to the reticle manufacturing method according to the first embodiment.

However, unlike the first embodiment, the main pattern of the reticle manufactured in the flowchart shown in FIG. 1 is based on the wiring pattern of the semiconductor apparatus. Therefore, among the spaces between the main patterns, the frequent space is different. Further, the arrangement of the assist pattern for ensuring a necessary depth of focus for the formed image of the main pattern having the frequent space is also different.

Figure 10:
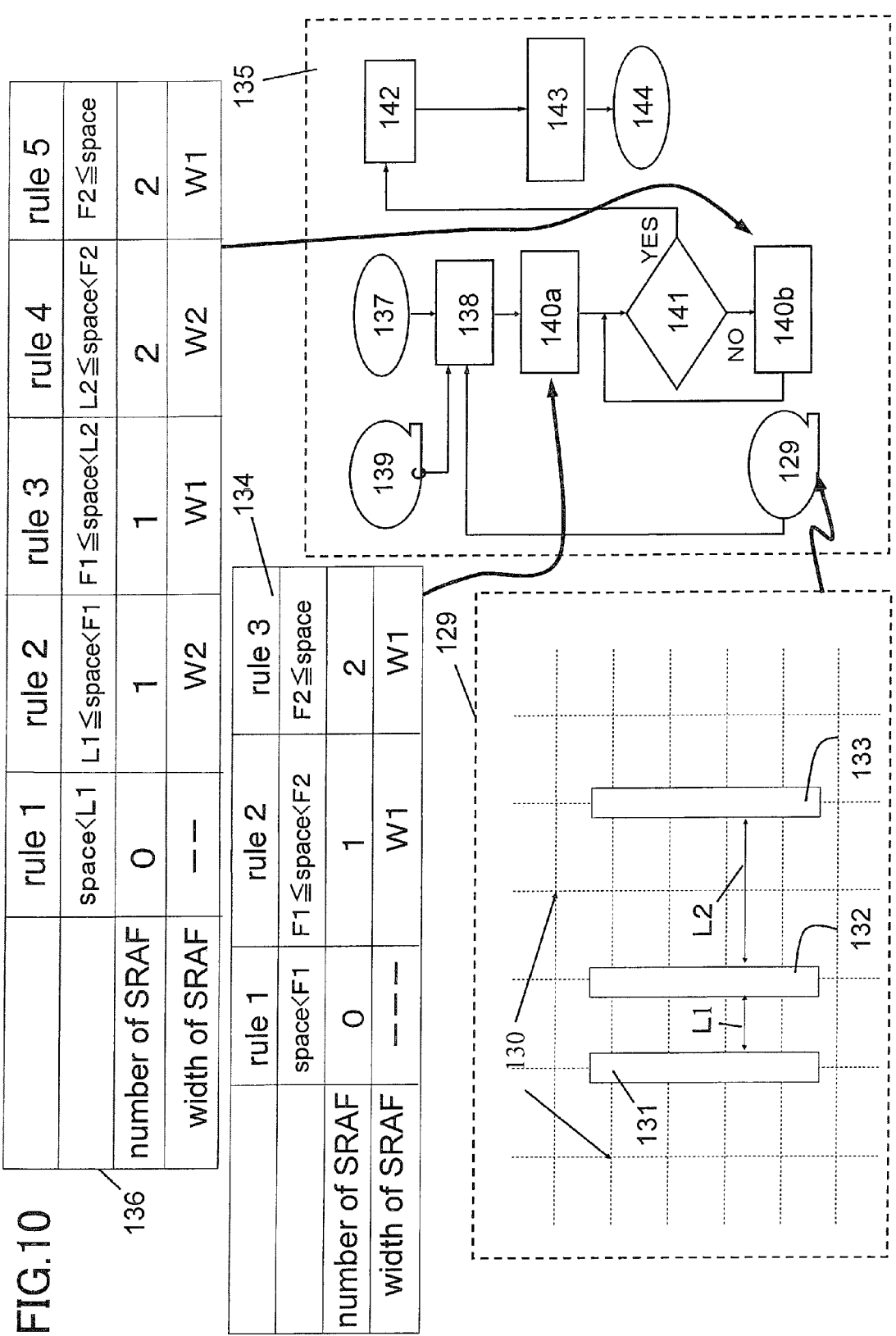
FIG. 10 is a diagram for illustrating a reticle manufacturing method according to the third embodiment for the purpose of describing the above-mentioned different points.

FIG. 10 is a diagram for illustrating the reticle manufacturing method according to the third embodiment for the purpose of the different points.

Referring to FIG. 10, reference numeral 129 denotes design data, reference numeral 130 denotes a wiring grid, reference numerals 131, 132, and 133 denote wiring patterns of the semiconductor apparatus, reference numeral 134 denotes a setting rule table of a predetermined assist pattern, reference numeral 135 denotes a flowchart of the reticle manufacturing method according to the third embodiment, reference numeral 136 denotes an arrangement rule table for improving the density of the assist pattern, reference numeral 137 denotes start of reticle manufacturing, reference numeral 138 denotes specifying of the frequent space, reference numeral 139c denotes a design rule, reference numeral 140a denotes setting of the assist pattern, reference numeral 140b denotes resetting of the assist pattern, reference numeral 141 denotes estimation of the depth of focus, reference numeral 142 denotes OPC processing, reference numeral 143 denotes formation of the reticle pattern, and reference numeral 144 denotes end of the reticle manufacturing.

The wiring grid 130 comprises a lattice point indicating a place where a wiring pattern can be arranged, i.e., a grid (a crossing point of a longitudinal dotted line and a lateral dotted line in FIG. 10). Further, by giving a wiring width to a line for connecting grid points, the wiring pattern is formed. The grid line is determined so as to efficiently accomplish a wiring pattern layout by limiting the arrangement place of the wiring pattern.

The wiring patterns 131, 132, and 133 of the semiconductor apparatus are wiring patterns arranged onto wiring grids. Further, a space between the center of the wiring pattern 131 of the semiconductor apparatus and the center of the wiring pattern 132 on the semiconductor apparatus is a one-grid space, and a space between the center of the wiring pattern 131 of the semiconductor apparatus and the center of the wiring pattern 133 on the semiconductor apparatus is a two-grid space. Incidentally, a space L1 between the wiring pattern 131 on the semiconductor apparatus and the wiring pattern 132 on the semiconductor apparatus is obtained by subtracting the minimum line width from the one-grid space. Further, a space L2 between the wiring pattern 131 on the semiconductor apparatus and the wiring pattern 132 on the semiconductor apparatus is obtained by subtracting the minimum line width from the two-grid space. That is, L1 and L2 are the spaces obtained by subtracting the minimum line width from an integer multiple of the grid space.

The design data 129 is expressing by the wiring pattern on the semiconductor apparatus as coordinates or by a circuit pattern of the semiconductor, e.g., expressing a wiring pattern for connecting the circuit element as coordinate.

The setting rule table 134 of the predetermined assist pattern is the same as the rule table shown in FIG. 4. Further, the arrangement rule table 136 for improving the density of the assist pattern is the same as the arrangement rule table for improving the density of assist pattern shown in FIG. 6. However, unlike the arrangement rule table in FIG. 6, S1 and S2 in the arrangement rule table for improving the density of assist pattern shown in FIG. 6 are replaced with L1 and L2 indicating the spaces between the wiring patterns.

The design rule 139c is the same as the design rule shown in FIG. 1.

The flowchart 135 of the reticle manufacturing method according to the third embodiment includes: the step 137 of starting the reticle manufacturing; the step 138 of specifying the frequent space; the step 140a of setting the assist pattern; the step 140b of resetting the assist pattern; the step 141 of estimating the depth of focus; the step 142 of the OPC processing; the step 143 of forming the reticle pattern; and the step 144 of ending the reticle manufacturing. Further, the steps are the same as the steps included in the flowchart shown in FIG. 1.

However, in the step 138 of specifying the frequent space, differently, "one or more frequent spaces, such as L1 or L2 are specified from among the spaces between the main patterns by using design rule", the space L1 between the wiring pattern 131 on the semiconductor apparatus and the wiring pattern 132 on the semiconductor apparatus and the space L2 between the wiring pattern 131 on the semiconductor apparatus and the wiring pattern 133 on the semiconductor apparatus are specified as the frequent spaces. Herein, the space L1 and the space L2 are the frequent spaces because it is estimated that the minimum line width can be frequently used for the wiring pattern in consideration of the chip size of the semiconductor apparatus that is set as a minimum one. Similarly, because it is estimated that the one-grid space or two-grid space as the minimum spaces can be frequently used for the space between the wiring patterns.

Therefore, with the reticle manufacturing method according to the third embodiment, in the setting 140a of the assist pattern, the assist pattern is created in accordance with the rule table 134. Thereafter, in the step 141 of estimating the depth of focus, it is determined whether or not the formed image of the wiring pattern having the spaces L1 and L2 on the semiconductor apparatus has the necessary depth of focus.

Consequently, if it is determined that the formed image of the wiring pattern having the spaces L1 and L2 on the semiconductor apparatus does not have the necessary depth of focus on the semiconductor apparatus, the step 140b of resetting the assist pattern is performed. Further, as the table 136 indicating the situation of the arrangement of the assist pattern, the assist pattern is arranged between the main patterns based on the wiring pattern on the semiconductor apparatus.

Incidentally, the step 138 of setting the assist pattern and the step 140b of resetting the assist pattern are performed by generating data indicating the assist pattern for the data indicating the main pattern on the calculator.

Consequently, with the reticle manufacturing method according to the third embodiment, it is possible to manufacture the reticle of the wiring pattern on the semiconductor apparatus that ensures the necessary depth of focus for the formed image of the main pattern with the frequent space on the reticle. Then, characteristics of a large number of wirings can be equalized. Thus, advantageously, the circuit on the semiconductor apparatus, concerned with the wiring pattern, has uniform characteristics.

4. Fourth Embodiment

A description will be given of a reticle manufacturing method according to the fourth embodiment with reference to FIG. 11. Herein, a reticle according to the fourth embodiment is for forming a wiring pattern on the semiconductor apparatus. Further, the method for manufacturing the reticle for forming the wiring pattern according to the fourth embodiment includes the steps shown in the flowchart in FIG. 1, similarly to the reticle manufacturing method according to the first embodiment.

However, differently, the main pattern of the reticle manufactured in the flowchart shown in FIG. 1 is based on the wiring pattern on the semiconductor apparatus. Therefore, among the spaces between the main patterns, the frequent space is different. Further, the arrangement of the assist pattern for ensuring the necessary depth of focus for the formed image of the main pattern having the frequent space is also different.

Figure 11:
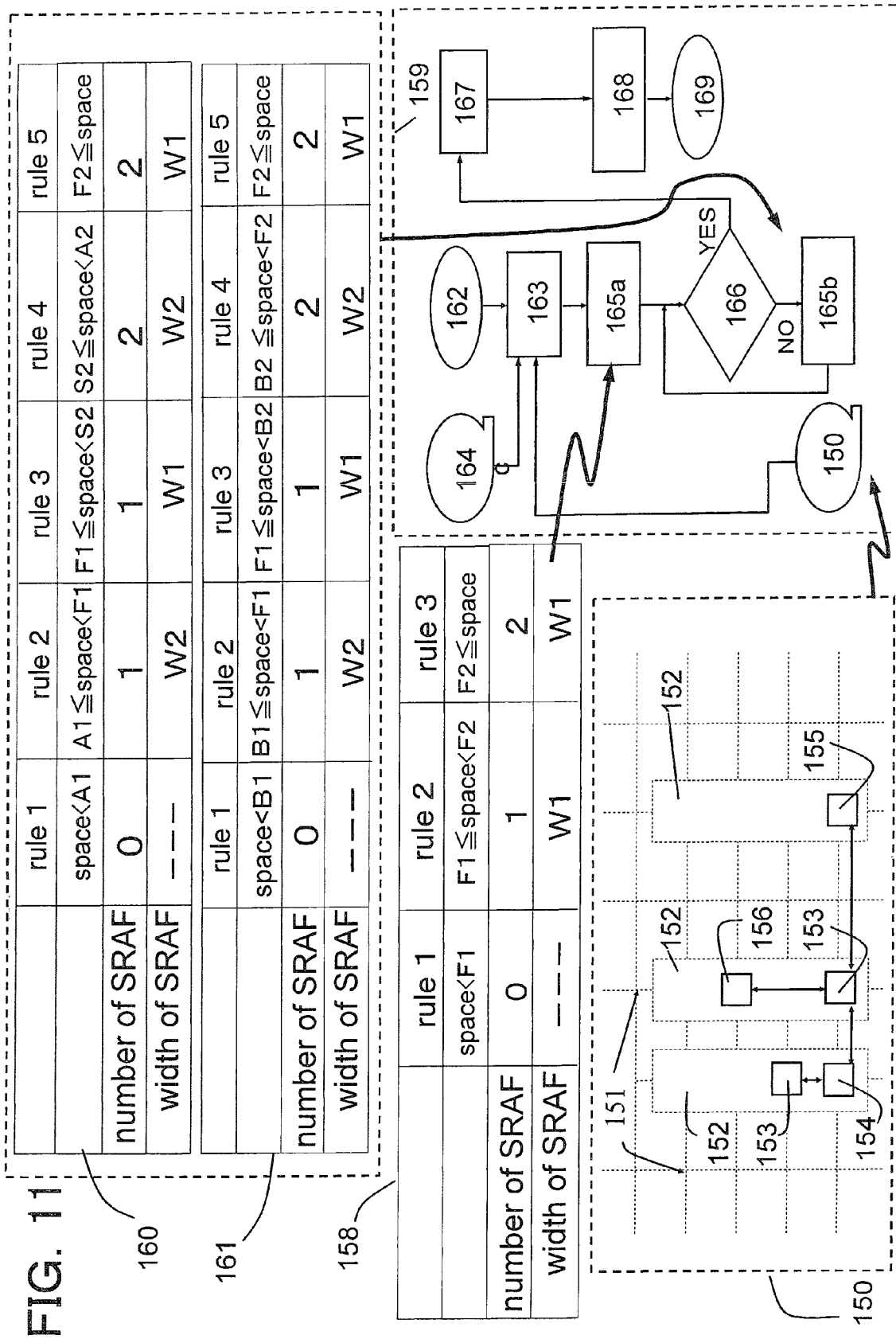
FIG. 11 is a diagram for illustrating a reticle manufacturing method according to the fourth embodiment for the purpose of describing the above-mentioned different points.

FIG. 11 is a diagram for illustrating the reticle manufacturing method according to the fourth embodiment for the purpose of describing the different points.

Referring to FIG. 11, reference numeral 150 denotes design data, reference numeral 151 denotes a via-grid, reference numeral 152 denotes a wiring pattern of the semiconductor apparatus, reference numerals 153, 154, 155, 156, and 157 denote via-patterns of the semiconductor apparatus, reference numeral 158 denotes a setting rule table of a predetermined assist pattern, reference numeral 159 denotes a flowchart of the reticle manufacturing method according to the fourth embodiment, reference numeral 160 denotes an arrangement rule table for improving the density of the assist pattern, reference numeral 161 denotes an arrangement rule table for improving the density of the assist pattern, reference numeral 162 denotes start of the reticle manufacturing, reference numeral 163 denotes specifying of the frequent space, reference numeral 164c denotes a design rule, reference numeral 165a denotes setting of the assist pattern, reference numeral 165b denotes resetting of the assist pattern, reference numeral 166 denotes estimation of the depth of focus, reference numeral 167 denotes a step of OPC processing, reference numeral 168 denotes formation of the reticle pattern, and reference numeral 169 denotes end of the reticle manufacturing.

The via-grid 151 comprises a lattice point indicating a place where a via-pattern can be arranged, i.e., a grid (a crossing point of a longitudinal dotted line and a lateral dotted line in FIG. 11). The grid line is determined as mentioned above because via-pattern layout is efficient by limiting the arrangement place of the via-pattern. Incidentally, the grid space of the via-grids 151 in the Y direction is different from the grid space in the X direction. Because the grid space in the Y direction is obtained by combination with a wiring grid on an upper wiring-layer and, on the other hand, the grid space in the X direction is obtained by combination with a wiring grid on a down wiring-layer.

The wiring pattern 152 is a wiring pattern arranged on the wiring grids. Further, the via-patterns 153, 154, 155, 156, and 157 are arranged on the wiring grids. Herein, the via exists at the place where an upper-layer wiring and a lower-layer wiring are overlapped to connect the wirings of the semiconductor apparatus. Further, the via-pattern forms the via.

The design data 150 is expressed by the via-pattern of the semiconductor apparatus as coordinate data, or by the circuit pattern, e.g., the pattern of the MOS transistor and a wiring pattern for connecting the circuit elements) as coordinate data.

The setting rule table 158 of the predetermined assist pattern is the same as the rule table shown in FIG. 4. Further, the arrangement rule table 160 for improving the density of the assist pattern is the same as the arrangement rule table for improving the density of the assist pattern shown in FIG. 6. However, the arrangement rule table 160 for improving the density of the assist pattern is an arrangement rule table for improving the density of the assist pattern between the via-pattern 153 and the via-pattern 154 or between the via-pattern 153 and the via-pattern 155, i.e., is sandwiched between the space in the Y direction, and S1 and S2 in the table are replaced with A1 and A2 showing the space between the via-patterns. The arrangement rule table 161 for improving the density of the assist pattern is the same as the arrangement rule table for improving the density of the assist pattern shown in FIG. 6. However, the arrangement rule table 161 for improving the density of the assist pattern is an arrangement rule table for improving the density of the assist pattern between the via-pattern 154 and the via-pattern 157 or between the via-pattern 153 and the via-pattern 156, i.e., is sandwiched between the space in the Y direction, and S1 and S2 in the table are replaced with B1 and B2 showing the space between the via-patterns.

The design rule 164c is the same as the design rule described above with reference to FIG. 1.

The flowchart 159 of the reticle manufacturing method according to the fourth embodiment comprises: the step 162 of starting the reticle manufacturing; the step 163 of specifying the frequent space; the step 165a of setting the assist pattern; the step 166 of estimating the depth of focus; the step of 165a of resetting the assist pattern; the step 167 of the OPC processing; the step 168 of forming the reticle pattern reticle; and the step 169 of ending the reticle manufacturing. Further, the steps are the same as those included in the flowchart shown in FIG. 1.

However, in the step 163 of specifying the frequent space, differently, the space B1 between the via-pattern 153 and the via-pattern 154 and the space B2 between the via-pattern 153 and the via-pattern 155 are specified as the frequent spaces "by specifying one or more frequent spaces among the spaces between the main patterns by estimation under the design rule". Further, differently, the space A1 between the via-pattern 154 and the via-pattern 157 and the space A2 between the via-pattern 153 and the via-pattern 156 are specified as the frequent spaces. Incidentally, A1 and A2 are the spaces obtained by subtracting the minimum width of the via-pattern from an integer multiple of the grid space in the X direction. Further, B1 and B2 are the spaces obtained by subtracting the minimum width of the via-pattern from an integer multiple of the grid in the Y direction. Herein, the spaces A1, A2, B1, and B2 are specified as the frequent spaces because of the following reasons. First, in consideration of minimizing the chip size of the semiconductor apparatus, it can be estimated that the width of the via-pattern can be frequently used. Further, since the via-pattern is permitted to be arranged only to the position of an integer multiple of the grid interval, it can be estimated that the via-pattern on the grid can be frequently arranged.

Therefore, with the reticle manufacturing method according to the fourth embodiment, in the step 165a of setting the assist pattern, the assist pattern is created under the rule table 158. Thereafter, in the step 166 of estimating the depth of focus, it is determined whether or not the formed image of the via-pattern with the spaces A1, A2, B1, and B2 on the semiconductor apparatus has the necessary depth of focus.

Consequently, if it is determined that the formed image of the via-pattern with the spaces A1, A2, B1, and B2 on the semiconductor apparatus does not have the necessary depth of focus, the step 165b of resetting the assist pattern is performed. Further, like the arrangement rule table 160 for improving the density of the assist pattern and the arrangement rule table 161 for improving the density of the assist pattern, the assist pattern is arranged between the main patterns based on the via-pattern on the semiconductor apparatus.

Incidentally, in the step 165a of setting the assist pattern and the step 165b of resetting the assist pattern, the data indicating the assist pattern is generated for the data indicating the main pattern on the calculator.

Consequently, with the reticle manufacturing method according to the fourth embodiment, it is possible to manufacture the reticle concerned with the via-pattern on the semiconductor apparatus that ensures the necessary depth of focus for the formed image of the main pattern with the frequent interval on the reticle. Then, characteristics of a large number of vias can be equalized. Advantageously, the circuit on the semiconductor apparatus, concerned with the via-pattern, has uniform characteristics.

5. Fifth Embodiment

Figure 12:
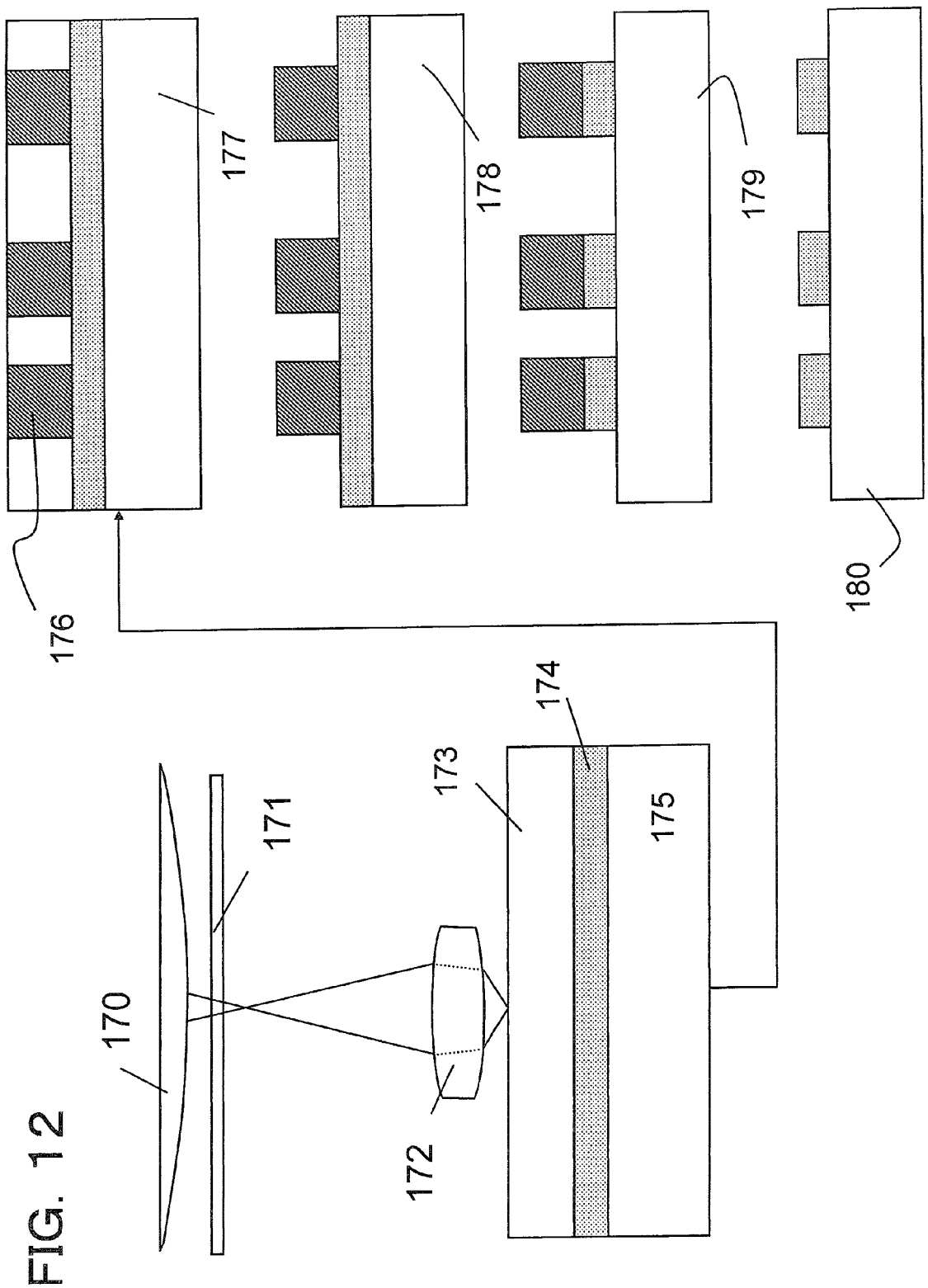
FIG. 12 is a diagram for illustrating a manufacturing method of a semiconductor apparatus using the manufactured reticle in steps shown in the flowchart of FIG. 1.

FIG. 12 is a diagram for illustrating a manufacturing method of a semiconductor apparatus using the manufactured reticle in the steps shown in the flowchart shown in FIG. 1 according to the fifth embodiment. Incidentally, the manufacturing method of the semiconductor apparatus comprises: a step of forming a resist pattern on a semiconductor substrate; and a step of forming a pattern on the semiconductor substrate by etching.

Referring to FIG. 12, reference numeral 170 denotes an illumination, reference numeral 171 denotes a reticle, reference numeral 172 denotes a projection lens, reference numeral 173 denotes resist, reference numeral 174 denotes a material layer forming the pattern, reference numeral 175 denotes a semiconductor substrate, reference numeral 176 denotes resist hardened by exposure, reference numeral 177 denotes a cross-sectional view after the resist exposure, reference numeral 178 denotes a cross-sectional view after removing the surplus resist, reference numeral 179 denotes a cross-sectional view after the etching, and reference numeral 180 denotes a cross-sectional view after removing all the resist.

Then, the steps of forming the resist pattern on the semiconductor substrate shown in FIG. 12 are performed in accordance with the following sequence. First, the material layer 174 forming the pattern is deposited onto the semiconductor substrate 175, and the resist 173 is coated. Subsequently, the illumination 170 illuminates the reticle 171, and the transmission light converged by the projection lens, thereby exposing the resist 173. Then, a state shown in the cross-sectional view 177 after the resist exposure is set. Subsequently, with a developing step, the resist 176 that is not exposed remains, and the surplus resist 173 is removed, thereby forming the resist pattern. Then, a state shown in the cross-sectional view 178 after removing the surplus resist is set.

Subsequently, the steps of forming the pattern on the semiconductor substrate by etching are performed in accordance with the following sequence. First, the resist pattern is subjected to anisotropic etching on the mask, thereby forming the pattern of the material layer 174 forming the pattern. Then, a state shown in the cross-sectional view 179 after etching is set. Subsequently, the resist pattern is removed, thereby setting a state shown in the cross-sectional view 180 after removing the resist pattern.

Figure 13:
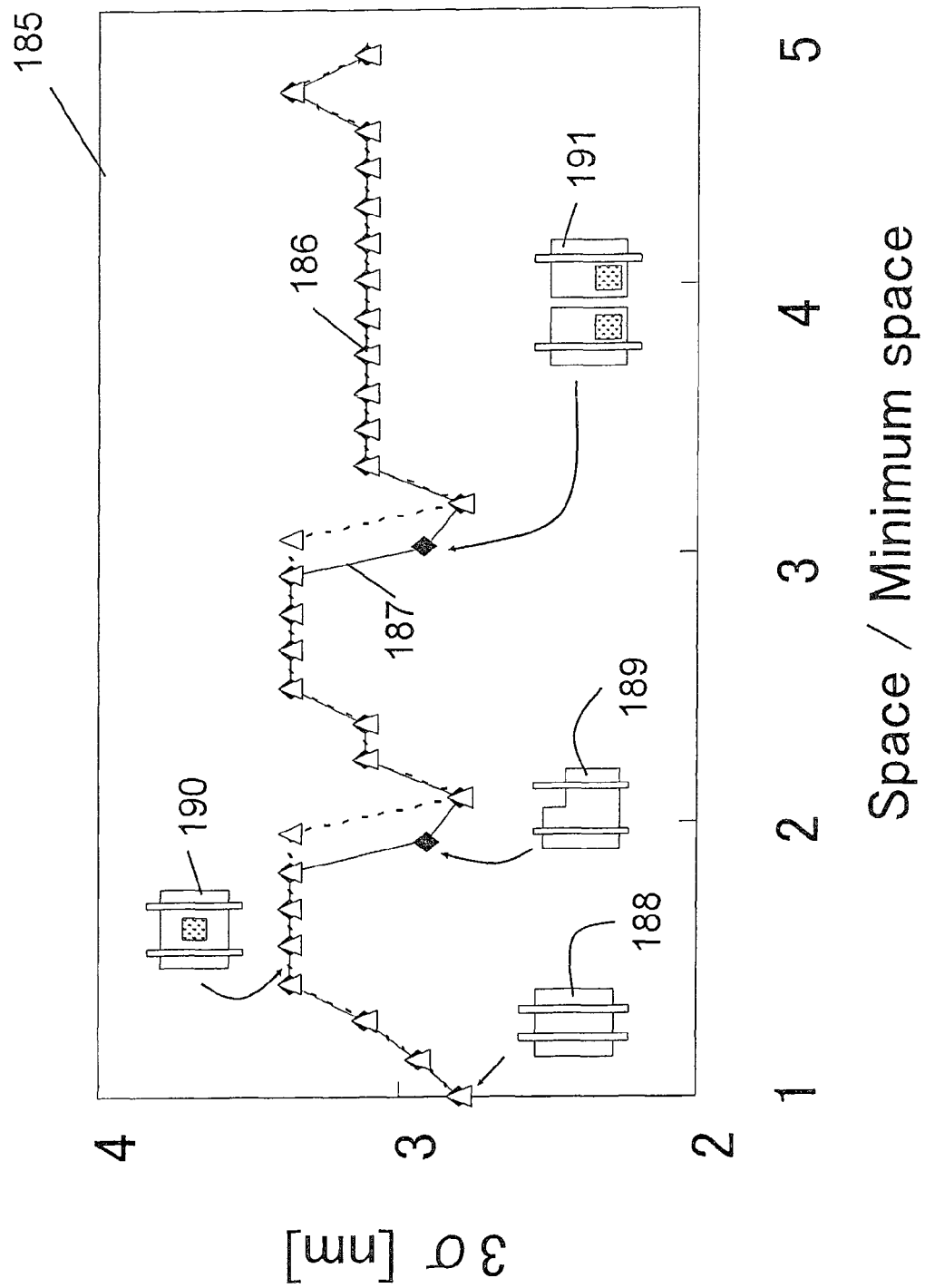
FIG. 13 is a diagram for illustrating advantages of the manufacturing method of the semiconductor apparatus using a reticle for forming a gate electrode pattern, manufactured in steps shown in the flowchart of Fig.

FIG. 13 is a diagram for illustrating the advantages of the manufacturing method of the semiconductor apparatus using the reticle for forming the gate electrode pattern manufactured in the steps in the flowchart shown in FIG. 1. Referring to FIG. 13, reference numeral 185 denotes a graph, reference numeral 186 denotes white triangles and a broken line for connecting the white triangles, reference numeral 187 denotes black rhombic shapes and a broken line for connecting the black rhombic shapes, reference numeral 188, 189, 190, and 191 denote pattern examples of the MOS transistor.

The graph 185 is obtained by evaluating the degree of variation of the widths of the finishing resist pattern on the semiconductor apparatus as a function of the spaces between the resist patterns of the standard deviation. Herein, the ordinate shows a value serving as a three-multiple of the standard deviation (herein below, described as "3σ") within a range from 2 nm to 4 nm. Further, the abscissa shows a ratio of the space between the resist patterns to the minimum space between the resist patterns by assuming the minimum space as "1", within a range from 1.0 to 5.0.

The broken line 186 shows the 3σ of the resist patterns as a function of the space between the resist patterns expressed by the ratio using the minimum space between the resist patterns in the situation for arranging the assist pattern shown in FIG. 4.

The broken line 187 shows the 3σ of the resist patterns as a function of the space between the resist patterns, expressed by the ratio using the minimum space between the resist patterns in the situation for arranging the assist pattern shown in FIG. 6.

Then, as comparing the broken line 186 with the broken line 187, the degree of variation is obviously improved.

Further, the graph 185 shows that the variation in resist patterns is suppressed with the space having a ratio of 2.0 and the space having a ratio of 3.0 in the situation for arranging the assist pattern shown in FIG. 6.

In other words, in the steps in the flowchart shown in FIG. 1, with the manufacturing method of the semiconductor apparatus using the manufactured reticle, upon transferring the main pattern of the reticle having the frequent space onto the resist on the semiconductor apparatus, advantageously, the variation in transferred resist patterns is suppressed. Advantageously, the circuit on the semiconductor apparatus, concerned with the transfer pattern, has uniform characteristics.

More advantageously, in the steps in the flowchart shown in FIG. 1, the formed image of the main pattern of the manufactured reticle having the frequent space has the necessary depth of focus. Herein, the necessary depth of focus preferably forms the pattern even in consideration of the change in best focusing position based on the caved and projected portions on the surface of the semiconductor apparatus or the focusing precision of the apparatus.

INDUSTRIAL APPLICABILITY

According to the first invention, it is possible to provide a manufacturing method of a photomask that obtains a preferable depth of focus for the formed image of the main pattern having the frequent space.

According to the second invention, it is possible to provide a manufacturing method of a semiconductor apparatus preferable to the miniaturization a pattern of the semiconductor apparatus.

The invention claimed is:

1. A method executed by a computer for creating a pattern on a photomask, the method comprising:
   recognizing spaces between main patterns by using pattern data which indicate the main patterns to be adjacently transferred onto a wafer, classifying the spaces between the main patterns into two or more groups, integrating the number of appearance times of the spaces between main patterns in each group, and specifying one or more groups on the basis of the number of appearance times of the space between main patterns;
   determining a 1st rule about arrangement of a 1st assist pattern on the photomask in accordance with the spaces which are specified by the one or more groups, the 1st assist pattern being adjacent to the main patterns and not being transferred onto the wafer;
   creating 1st pattern data on the basis of the 1st rule;
   estimating a depth of focus in the presence of the 1st assist pattern among the main patterns;
   determining a 2nd rule about arrangement of a 2nd assist pattern on the photomask to improve the depth of focus in the presence of the 1st assist pattern among the main patterns in accordance with the spaces which are specified by the one or more groups, the 2nd assist pattern being adjacent to the main patterns and not being transferred onto the wafer;
   creating a 2nd assist pattern data on the basis of the 2nd rule, and
   arranging a 2nd assist pattern by using the 2nd assist pattern data on the photomask.

2. The method for creating a pattern on a photomask according to claim 1, wherein specifying a group having the one or more frequent spaces further comprising:
   classifying an arrangement space between the main patterns included in standard cell and custom macro cell layout data; and
   estimating the number of appearance times of the standard cell and custom macro cell layout data appearing in accordance with data on the photomask pattern data.

3. The method for creating a photomask pattern according to claim 2, wherein the frequent space in an X direction is obtained by subtracting a minimum line width from an integer-multiple of a grid in the X direction from among the frequent spaces, and the frequent space in a Y direction is obtained by subtracting a minimum line width from an integer-multiple of a grid in the Y direction from among the frequent spaces.

4. The method for creating a pattern on a photomask according to claim 1, further comprising a design rule check.

5. The method for creating a pattern on a photomask according to claim 1, wherein the main pattern is a gate electrode pattern.

6. The method for creating a pattern on a photomask according to claim 1, wherein the main pattern is a contact pattern.

7. The method for creating a pattern on a photomask according to claim 1, wherein the main pattern is a wiring pattern.

8. The method for creating a photomask pattern according to claim 1, wherein a line width of the 2nd assist pattern is smaller than a line width of the 1st assist pattern.

9. The method for creating a photomask pattern according to claim 1, wherein the main pattern is a via-pattern.

10. The method for creating a photomask pattern according to claim 9, wherein the assist pattern is arranged in the X direction and the Y direction.

11. A method executed by a computer for creating a pattern on a photomask, the method comprising:

recognizing a space between main patterns by using pattern data which indicate the main patterns to be adjacently transferred onto a wafer, classifying the spaces between the main patterns into two or more groups, integrating the number of appearance times of the spaces between main patterns in each group, and specifying one or more groups on the basis of the number of appearance times of the space between main patterns;

determining a 1st rule about arrangement of a 1st assist pattern on the photomask in accordance with the spaces which are specified by the one or more groups, the 1st assist pattern being adjacent to the main patterns and not being transferred onto the wafer;

creating 1st pattern data on the basis of the 1st rule;

estimating a depth of focus in the presence of the 1st assist pattern in accordance with the 1st rule among the main patterns;

determining a 2nd rule about arrangement of a 1st assist pattern on the photomask to improve the depth of focus in the presence of the 1st assist pattern in accordance with the 1st rule among the main patterns in a group having one or more number of appearance times of the space between main patterns;

correcting the 1st assist pattern data on the basis of depth of focus; and arranging the 1st assist pattern by using the corrected 1st assist pattern data on the photomask.

12. A photomask created by using a photomask pattern created by a method executed on a computer, the method comprising:

recognizing spaces between main patterns by using pattern data which indicate the main patterns to be adjacently transferred onto a wafer, classifying the spaces between the main patterns into two or more groups, integrating the number of appearance times of the spaces between main patterns in each group, and specifying one or more groups on the basis of the number of appearance times of the space between main patterns;

determining a 1st rule about arrangement of a 1st assist pattern on the photomask in accordance with the spaces which are specified by the one or more groups, the 1st assist pattern being adjacent to the main patterns and not being transferred onto the wafer;

creating 1st pattern data on the basis of the 1st rule;

estimating a depth of focus in the presence of the 1st assist pattern among the main patterns;

determining a 2nd rule about arrangement of a 2nd assist pattern on the photomask to improve the depth of focus in the presence of the 1st assist pattern among the main patterns in accordance with the spaces which are specified by the one or more groups, the 2nd assist pattern being adjacent to the main patterns and not being transferred onto the wafer;

creating a 2nd assist pattern data on the basis of the 2nd rule, and arranging a 2nd assist pattern by using the 2nd assist pattern data on the photomask.

13. The photomask created by using the photomask pattern according to claim 12, further comprising a step of creating a resist pattern.

14. A photomask created by using a method for creating a photomask pattern executed by a computer, the method comprising: the recognizing spaces between main patterns by using pattern data which indicate the main patterns to be adjacently transferred onto a wafer, classifying the spaces between the main patterns into two or more groups, integrating the number of appearance times of the spaces between main patterns in each group, and specifying one or more groups on the basis of the number of appearance times of the space between main patterns;

determining a 1st rule about arrangement of a 1st assist pattern on the photomask in accordance with the spaces specified one or more groups, the 1st assist pattern being adjacent to the main patterns and not being transferred onto the wafer;

creating 1st assist pattern data on the basis of the 1st rule;

estimating a depth of focus in the presence of the 1st assist pattern among the main patterns in accordance with the 1st rule;

determining a 2nd rule about arrangement of a 2nd assist pattern on the photomask to improve the depth of focus in the presence of the 1st assist pattern among the main patterns in accordance with the spaces specified one or more groups, the 2nd assist pattern being adjacent to the main patterns and not being transferred onto the wafer;

creating 2nd assist pattern data on the basis of the 2nd rule; and arranging a 2nd assist pattern by using the 2nd assist pattern data on the photomask, wherein, the main pattern is a via-pattern.

15. The photomask created by using the photomask pattern according to claim 14, further comprising a step of creating a resist pattern on a semiconductor substrate by using the photomask.

* * * * *